(12) United States Patent
Takayama et al.

(10) Patent No.: US 9,842,994 B2
(45) Date of Patent: Dec. 12, 2017

(54) PEELING METHOD AND METHOD OF MANUFACTURING SEMICONDUCTOR DEVICE

(71) Applicant: Semiconductor Energy Laboratory Co., Ltd., Atsugi-shi, Kanagawa-ken (JP)

(72) Inventors: Toru Takayama, Kanagawa (JP); Junya Maruyama, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/143,791

(22) Filed: May 2, 2016

(65) Prior Publication Data
US 2016/0248013 A1    Aug. 25, 2016

Related U.S. Application Data

(60) Division of application No. 15/059,623, filed on Mar. 3, 2016, which is a continuation of application No.
(Continued)

(30) Foreign Application Priority Data

Aug. 22, 2001  (JP) .................................. 2001-251870

(51) Int. Cl.
*H01L 51/00* (2006.01)
*B32B 7/06* (2006.01)
(Continued)

(52) U.S. Cl.
CPC .............. *H01L 51/003* (2013.01); *B32B 7/06* (2013.01); *B32B 43/006* (2013.01);
(Continued)

(58) Field of Classification Search
CPC ... B32B 7/06; B32B 43/006; H01L 21/76251; H01L 27/1214; H01L 27/1266;
(Continued)

(56) References Cited

U.S. PATENT DOCUMENTS 4,722,765 A    2/1988  Ambros et al.
5,107,175 A    4/1992  Hirano et al.
(Continued)

FOREIGN PATENT DOCUMENTS

CN    001256794 A    6/2000
CN    001312590 A    9/2001
(Continued)

OTHER PUBLICATIONS

Chen.Y et al., "A Conformable Electronic Ink Display Using a Foil-Based A-Si TFT Array", SID Digest '01 : SID International Symposium Digest of Technical Papers, 2001, vol. 32, pp. 157-159.
(Continued)

*Primary Examiner* — Walter H Swanson
(74) *Attorney, Agent, or Firm* — Fish & Richardson P.C.

(57) ABSTRACT

There is provided a peeling method capable of preventing a damage to a layer to be peeled. Thus, not only a layer to be peeled having a small area but also a layer to be peeled having a large area can be peeled over the entire surface at a high yield. Processing for partially reducing contact property between a first material layer (11) and a second material layer (12) (laser light irradiation, pressure application, or the like) is performed before peeling, and then peeling is conducted by physical means. Therefore, sufficient separation can be easily conducted in an inner portion of the second material layer (12) or an interface thereof.

14 Claims, 18 Drawing Sheets

Related U.S. Application Data

14/207,759, filed on Mar. 13, 2014, now Pat. No. 9,281,403, which is a division of application No. 13/466,212, filed on May 8, 2012, now Pat. No. 8,674,364, which is a continuation of application No. 12/477,966, filed on Jun. 4, 2009, now Pat. No. 8,338,198, which is a continuation of application No. 12/016,274, filed on Jan. 18, 2008, now Pat. No. 7,825,002, which is a continuation of application No. 10/218,042, filed on Aug. 14, 2002, now Pat. No. 7,351,300.

(51) Int. Cl.

| | | |
|---|---|---|
| *B32B 43/00* | (2006.01) | |
| *G02F 1/1368* | (2006.01) | |
| *H01L 21/762* | (2006.01) | |
| *H01L 27/12* | (2006.01) | |
| *H01L 27/32* | (2006.01) | |
| *H01L 29/66* | (2006.01) | |
| *H01L 29/786* | (2006.01) | |
| *H01L 51/56* | (2006.01) | |
| *G02F 1/136* | (2006.01) | |
| *H01L 21/322* | (2006.01) | |
| *H01L 51/52* | (2006.01) | |

(52) U.S. Cl.
CPC ...... *G02F 1/1368* (2013.01); *H01L 21/76251* (2013.01); *H01L 27/1214* (2013.01); *H01L 27/1266* (2013.01); *H01L 27/3246* (2013.01); *H01L 27/3248* (2013.01); *H01L 27/3258* (2013.01); *H01L 29/6675* (2013.01); *H01L 29/66757* (2013.01); *H01L 29/78663* (2013.01); *H01L 51/0097* (2013.01); *H01L 51/56* (2013.01); *B32B 2310/0843* (2013.01); *B32B 2457/08* (2013.01); *B32B 2457/14* (2013.01); *G02F 2001/13613* (2013.01); *H01L 21/3221* (2013.01); *H01L 27/3244* (2013.01); *H01L 51/529* (2013.01); *H01L 51/5237* (2013.01); *H01L 51/5246* (2013.01); *H01L 2227/323* (2013.01); *H01L 2227/326* (2013.01); *H01L 2251/5338* (2013.01); *Y10S 438/977* (2013.01); *Y10T 156/1137* (2015.01); *Y10T 156/1939* (2015.01)

(58) Field of Classification Search
CPC ............. H01L 29/66757; H01L 51/003; H01L 29/6675; H01L 29/78663; H01L 27/3246; H01L 27/3248; H01L 27/3258; H01L 51/0097; H01L 51/56; H01L 25/167; H01L 27/15; H01L 31/12; G02F 1/1368
USPC .......................................................... 438/23
See application file for complete search history.

(56) References Cited

U.S. PATENT DOCUMENTS

| | | |
|---|---|---|
| 5,124,204 A | 6/1992 | Yamashita et al. |
| 5,156,720 A | 10/1992 | Rosenfeld et al. |
| 5,189,405 A | 2/1993 | Yamashita et al. |
| 5,206,749 A | 4/1993 | Zavracky et al. |
| 5,258,325 A | 11/1993 | Spitzer et al. |
| 5,317,236 A | 5/1994 | Zavracky et al. |
| 5,341,015 A | 8/1994 | Kohno |
| 5,376,561 A | 12/1994 | Vu et al. |
| 5,391,257 A | 2/1995 | Sullivan et al. |
| 5,397,713 A | 3/1995 | Hamamoto et al. |
| 5,654,811 A | 8/1997 | Spitzer et al. |
| 5,674,304 A | 10/1997 | Fukada et al. |
| 5,686,360 A | 11/1997 | Harvey et al. |
| 5,693,956 A | 12/1997 | Shi et al. |
| 5,757,126 A | 5/1998 | Harvey et al. |
| 5,757,456 A | 5/1998 | Yamazaki et al. |
| 5,771,562 A | 6/1998 | Harvey et al. |
| 5,781,164 A | 7/1998 | Jacobsen et al. |
| 5,807,440 A | 9/1998 | Kubota et al. |
| 5,811,177 A | 9/1998 | Shi et al. |
| 5,815,223 A | 9/1998 | Watanabe et al. |
| 5,821,138 A * | 10/1998 | Yamazaki ........... H01L 21/2022 257/72 |
| 5,834,327 A * | 11/1998 | Yamazaki ........... G02F 1/13452 438/30 |
| 5,851,862 A | 12/1998 | Ohtani et al. |
| 5,879,741 A | 3/1999 | Itoh |
| 5,888,712 A | 3/1999 | Lelental et al. |
| 5,929,961 A | 7/1999 | Nishi et al. |
| 5,952,778 A | 9/1999 | Haskal et al. |
| 5,985,742 A | 11/1999 | Henley et al. |
| 5,990,542 A | 11/1999 | Yamazaki |
| 5,994,207 A | 11/1999 | Henley et al. |
| 6,010,579 A | 1/2000 | Henley et al. |
| 6,013,563 A | 1/2000 | Henley et al. |
| 6,013,567 A | 1/2000 | Henley et al. |
| 6,033,974 A | 3/2000 | Henley et al. |
| 6,043,800 A | 3/2000 | Spitzer et al. |
| 6,048,411 A | 4/2000 | Henley et al. |
| 6,059,913 A | 5/2000 | Asmussen et al. |
| 6,080,663 A | 6/2000 | Chen et al. |
| 6,100,166 A | 8/2000 | Sakaguchi et al. |
| 6,118,502 A | 9/2000 | Yamazaki et al. |
| 6,127,199 A | 10/2000 | Inoue et al. |
| 6,146,225 A | 11/2000 | Sheats et al. |
| 6,146,979 A | 11/2000 | Henley et al. |
| 6,150,187 A | 11/2000 | Zyung et al. |
| 6,155,909 A | 12/2000 | Henley et al. |
| 6,159,824 A | 12/2000 | Henley et al. |
| 6,159,825 A | 12/2000 | Henley et al. |
| 6,162,705 A | 12/2000 | Henley et al. |
| 6,187,110 B1 | 2/2001 | Henley et al. |
| 6,198,217 B1 | 3/2001 | Suzuki et al. |
| 6,198,220 B1 | 3/2001 | Jones et al. |
| 6,204,610 B1 | 3/2001 | Komiya |
| 6,221,738 B1 | 4/2001 | Sakaguchi et al. |
| 6,239,470 B1 | 5/2001 | Yamazaki |
| 6,245,161 B1 | 6/2001 | Henley et al. |
| 6,258,666 B1 | 7/2001 | Mizutani et al. |
| 6,261,634 B1 | 7/2001 | Itoh |
| 6,268,695 B1 | 7/2001 | Affinito |
| 6,284,631 B1 | 9/2001 | Henley et al. |
| 6,290,804 B1 | 9/2001 | Henley et al. |
| 6,291,313 B1 | 9/2001 | Henley et al. |
| 6,294,814 B1 | 9/2001 | Henley et al. |
| 6,310,362 B1 | 10/2001 | Takemura |
| 6,320,640 B2 | 11/2001 | Nishi et al. |
| 6,335,264 B1 | 1/2002 | Henley et al. |
| 6,339,010 B2 | 1/2002 | Sameshima |
| 6,340,641 B1 | 1/2002 | Muraguchi et al. |
| 6,362,866 B1 | 3/2002 | Yamazaki et al. |
| 6,372,608 B1 | 4/2002 | Shimoda et al. |
| 6,376,333 B1 | 4/2002 | Yamazaki et al. |
| 6,391,220 B1 | 5/2002 | Zhang et al. |
| 6,391,740 B1 | 5/2002 | Cheung et al. |
| 6,413,645 B1 | 7/2002 | Graff et al. |
| 6,420,283 B1 | 7/2002 | Ogawa et al. |
| 6,423,614 B1 | 7/2002 | Doyle |
| 6,429,095 B1 | 8/2002 | Sakaguchi et al. |
| 6,441,468 B1 | 8/2002 | Yamazaki |
| 6,448,152 B1 | 9/2002 | Henley et al. |
| 6,458,672 B1 | 10/2002 | Henley et al. |
| 6,486,041 B2 | 11/2002 | Henley et al. |
| 6,492,026 B1 | 12/2002 | Graff et al. |
| 6,498,114 B1 | 12/2002 | Amundson et al. |
| 6,506,438 B2 | 1/2003 | Duthaler et al. |
| 6,511,899 B1 | 1/2003 | Henley et al. |
| 6,521,511 B1 | 2/2003 | Inoue et al. |
| 6,522,067 B1 | 2/2003 | Graff et al. |
| 6,528,391 B1 | 3/2003 | Henley et al. |
| 6,534,382 B1 | 3/2003 | Sakaguchi et al. |

(56) References Cited

U.S. PATENT DOCUMENTS

| | | |
|---|---|---|
| 6,544,430 B2 | 4/2003 | Mccormack et al. |
| 6,558,802 B1 | 5/2003 | Henley et al. |
| 6,572,780 B2 | 6/2003 | Mccormack et al. |
| 6,582,999 B2 | 6/2003 | Henley et al. |
| 6,627,518 B1 | 9/2003 | Inoue et al. |
| 6,632,708 B2 | 10/2003 | Sakama et al. |
| 6,632,724 B2 | 10/2003 | Henley et al. |
| 6,642,542 B1 | 11/2003 | Shimoda et al. |
| 6,645,830 B2 | 11/2003 | Shimoda et al. |
| 6,664,169 B1 | 12/2003 | Iwasaki et al. |
| 6,682,963 B2 | 1/2004 | Ishikawa |
| 6,682,990 B1 | 1/2004 | Iwane et al. |
| RE38,466 E | 3/2004 | Inoue et al. |
| 6,700,631 B1 | 3/2004 | Inoue et al. |
| 6,737,285 B2 | 5/2004 | Iketani et al. |
| 6,753,212 B2 | 6/2004 | Yamazaki et al. |
| 6,774,010 B2 | 8/2004 | Chu et al. |
| 6,781,152 B2 | 8/2004 | Yamazaki |
| 6,784,113 B2 | 8/2004 | Hembree |
| 6,790,747 B2 | 9/2004 | Henley et al. |
| 6,802,926 B2 | 10/2004 | Mizutani et al. |
| 6,814,832 B2 | 11/2004 | Utsunomiya |
| 6,815,240 B2 | 11/2004 | Hayashi |
| 6,818,530 B2 | 11/2004 | Shimoda et al. |
| 6,875,671 B2 | 4/2005 | Faris |
| 6,878,607 B2 | 4/2005 | Inoue et al. |
| 6,885,389 B2 | 4/2005 | Inoue et al. |
| 6,943,369 B2 | 9/2005 | Hayashi |
| 6,946,361 B2 | 9/2005 | Takayama et al. |
| 6,953,735 B2 | 10/2005 | Yamazaki et al. |
| 6,965,195 B2 | 11/2005 | Yamazaki et al. |
| 6,967,114 B2 | 11/2005 | Shimoda et al. |
| 6,974,731 B2 | 12/2005 | Yamazaki et al. |
| 7,045,438 B2 | 5/2006 | Yamazaki et al. |
| 7,045,442 B2 | 5/2006 | Maruyama et al. |
| 7,050,138 B1 | 5/2006 | Yamazaki et al. |
| 7,052,978 B2 | 5/2006 | Shaheen et al. |
| 7,094,665 B2 | 8/2006 | Shimoda et al. |
| 7,119,364 B2 | 10/2006 | Yamazaki |
| 7,122,445 B2 | 10/2006 | Takayama et al. |
| 7,160,790 B2 | 1/2007 | Henley et al. |
| 7,180,091 B2 | 2/2007 | Yamazaki et al. |
| 7,189,631 B2 | 3/2007 | Yamazaki et al. |
| 7,214,555 B2 | 5/2007 | Yamazaki et al. |
| 7,271,858 B2 | 9/2007 | Yamazaki et al. |
| 7,285,476 B2 | 10/2007 | Shimoda et al. |
| 7,332,381 B2 | 2/2008 | Maruyama et al. |
| 7,348,258 B2 | 3/2008 | Henley et al. |
| 7,371,660 B2 | 5/2008 | Henley et al. |
| 7,410,887 B2 | 8/2008 | Henley et al. |
| 7,442,957 B2 | 10/2008 | Yamazaki et al. |
| 7,446,843 B2 | 11/2008 | Yamazaki et al. |
| RE40,601 E | 12/2008 | Inoue et al. |
| 7,468,308 B2 | 12/2008 | Shimoda |
| 7,470,600 B2 | 12/2008 | Henley et al. |
| 7,479,442 B2 | 1/2009 | Noguchi et al. |
| 7,483,091 B1 | 1/2009 | Yamazaki et al. |
| 2001/0002703 A1 | 6/2001 | Koyama |
| 2001/0004121 A1 | 6/2001 | Sakama et al. |
| 2001/0005606 A1 | 6/2001 | Tanaka et al. |
| 2001/0012677 A1 | 8/2001 | Sameshima |
| 2001/0022362 A1 | 9/2001 | Hayashi |
| 2001/0040645 A1 | 11/2001 | Yamazaki |
| 2001/0041392 A1 | 11/2001 | Suzawa et al. |
| 2001/0055841 A1 | 12/2001 | Yamazaki et al. |
| 2002/0004250 A1 | 1/2002 | Iketani et al. |
| 2002/0004292 A1 | 1/2002 | Yamazaki et al. |
| 2002/0017681 A1 | 2/2002 | Inoue et al. |
| 2002/0048864 A1 | 4/2002 | Yamazaki et al. |
| 2002/0055266 A1 | 5/2002 | Henley et al. |
| 2002/0056519 A1 | 5/2002 | Henley et al. |
| 2002/0081823 A1 | 6/2002 | Cheung et al. |
| 2002/0106522 A1 | 8/2002 | Mccormack et al. |
| 2002/0117256 A1 | 8/2002 | Mccormack et al. |
| 2002/0146893 A1 | 10/2002 | Shimoda et al. |
| 2003/0008437 A1 | 1/2003 | Inoue et al. |
| 2003/0024635 A1 | 2/2003 | Utsunomiya |
| 2003/0025118 A1 | 2/2003 | Yamazaki et al. |
| 2003/0032210 A1 | 2/2003 | Takayama et al. |
| 2003/0040164 A1 | 2/2003 | Inoue et al. |
| 2003/0047732 A1 | 3/2003 | Yamazaki et al. |
| 2003/0064569 A1 | 4/2003 | Takayama et al. |
| 2003/0071953 A1 | 4/2003 | Yamazaki et al. |
| 2003/0082889 A1 | 5/2003 | Maruyama et al. |
| 2003/0134488 A1 | 7/2003 | Yamazaki et al. |
| 2003/0162312 A1 | 8/2003 | Takayama et al. |
| 2003/0203547 A1 | 10/2003 | Sakaguchi et al. |
| 2003/0217805 A1 | 11/2003 | Takayama et al. |
| 2003/0224582 A1 | 12/2003 | Shimoda et al. |
| 2004/0087110 A1 | 5/2004 | Takayama et al. |
| 2004/0129960 A1 | 7/2004 | Maruyama et al. |
| 2004/0132265 A1 | 7/2004 | Maruyama et al. |
| 2004/0219762 A1 | 11/2004 | Shimoda et al. |
| 2004/0232413 A1 | 11/2004 | Yamazaki et al. |
| 2005/0017255 A1 | 1/2005 | Yamazaki |
| 2005/0048320 A1 | 3/2005 | Kobayashi |
| 2005/0070038 A1 | 3/2005 | Yamazaki et al. |
| 2006/0121691 A1 | 6/2006 | Noguchi et al. |
| 2007/0122997 A1 | 5/2007 | Henley et al. |
| 2007/0123013 A1 | 5/2007 | Henley et al. |
| 2007/0212853 A1 | 9/2007 | Maruyama et al. |
| 2008/0038901 A1 | 2/2008 | Henley et al. |
| 2008/0182386 A1 | 7/2008 | Henley et al. |
| 2008/0188022 A1 | 8/2008 | Yamazaki et al. |
| 2008/0286945 A1 | 11/2008 | Henley et al. |
| 2009/0108263 A1 | 4/2009 | Yamazaki et al. |
| 2009/0185130 A1 | 7/2009 | Yamazaki et al. |
| 2009/0239320 A1 | 9/2009 | Takayama et al. |

FOREIGN PATENT DOCUMENTS

| | | |
|---|---|---|
| CN | 001332471 A | 1/2002 |
| EP | 0849788 A | 6/1998 |
| EP | 0858110 A | 8/1998 |
| EP | 0924769 A | 6/1999 |
| EP | 0951057 A | 10/1999 |
| EP | 1014452 A | 6/2000 |
| EP | 1122794 A | 8/2001 |
| EP | 1351308 A | 10/2003 |
| EP | 1655633 A | 5/2006 |
| EP | 1744365 A | 1/2007 |
| EP | 1758169 A | 2/2007 |
| JP | 01-184957 A | 7/1989 |
| JP | 05-243519 A | 9/1993 |
| JP | 05-347186 A | 12/1993 |
| JP | 07-142570 A | 6/1995 |
| JP | 08-250745 A | 9/1996 |
| JP | 09-105896 A | 4/1997 |
| JP | 09-293872 A | 11/1997 |
| JP | 10-125929 A | 5/1998 |
| JP | 10-125930 A | 5/1998 |
| JP | 10-125931 A | 5/1998 |
| JP | 11-020360 A | 1/1999 |
| JP | 11-026734 A | 1/1999 |
| JP | 11-087799 A | 3/1999 |
| JP | 11-135882 A | 5/1999 |
| JP | 11-243209 A | 9/1999 |
| JP | 2000-040812 A | 2/2000 |
| JP | 2001-051296 A | 2/2001 |
| JP | 2001-085154 A | 3/2001 |
| JP | 2001-125138 A | 5/2001 |
| JP | 2001-155134 A | 6/2001 |
| JP | 2001-166301 A | 6/2001 |
| JP | 2001-189460 A | 7/2001 |
| JP | 2001-267578 A | 9/2001 |
| JP | 3238223 | 12/2001 |
| JP | 2002-184959 A | 6/2002 |
| JP | 2002-217391 A | 8/2002 |
| JP | 2002-328624 A | 11/2002 |
| JP | 2003-142666 A | 5/2003 |
| WO | WO-92/12453 | 7/1992 |
| WO | WO-98/21750 | 5/1998 |

(56) References Cited

FOREIGN PATENT DOCUMENTS

| WO | WO-98/52216 | 11/1998 |
|----|-------------|---------|
| WO | WO-99/44242 | 9/1999  |

OTHER PUBLICATIONS

Takayama.T et al., "U.S. Appl. No. 10/215,181".
Takayama.T et al., "A CPU on a Plastic Film Substrate", 2004 Symposium on VLSI Technology : Digest of Technical Papers, Jun. 15, 2004, pp. 230-231, The IEEE Electron Devices Society / The Japan Society of Applied Physics.

* cited by examiner

PEELING DIRECTION

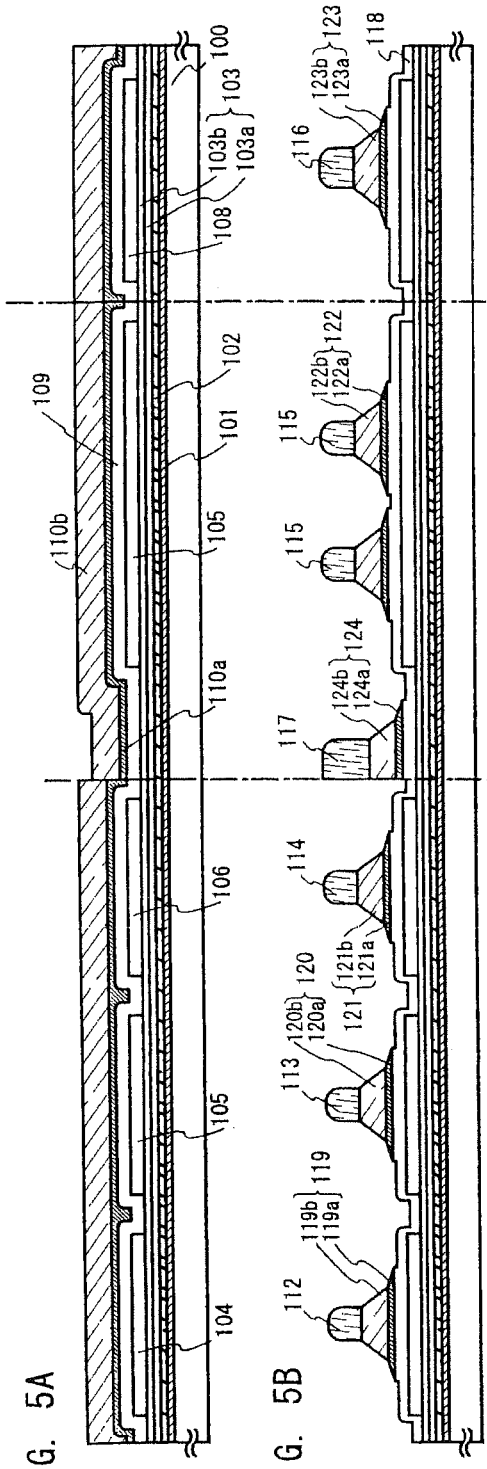
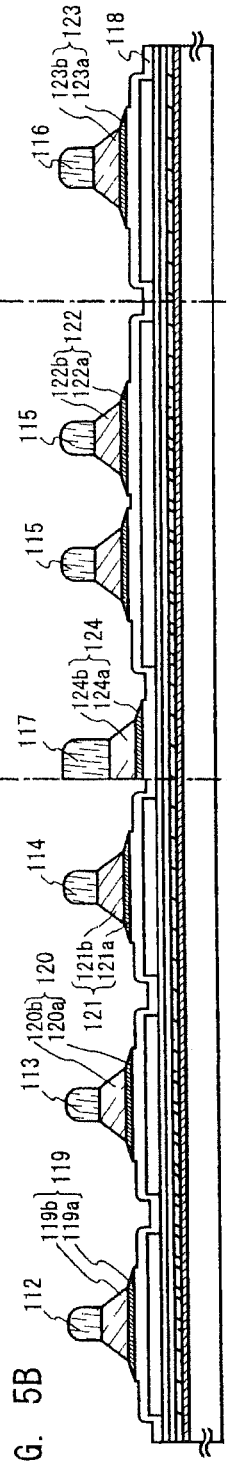
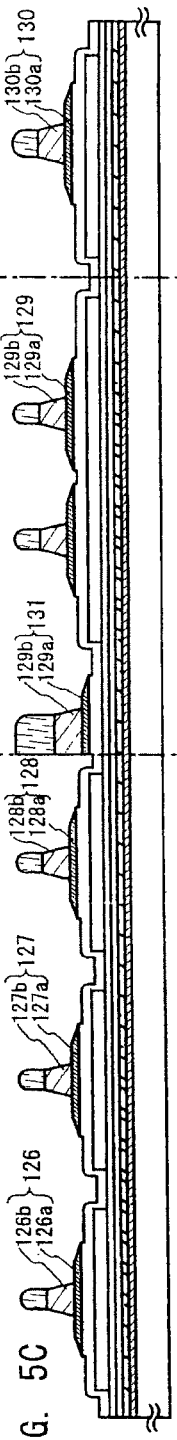
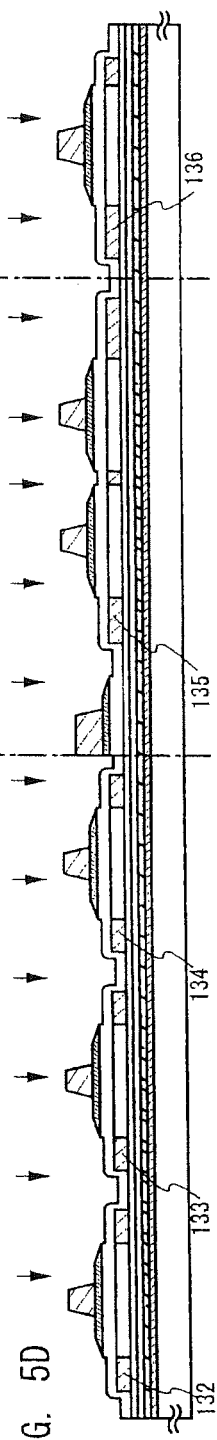
FIG. 5A
FIG. 5B
FIG. 5C
FIG. 5D

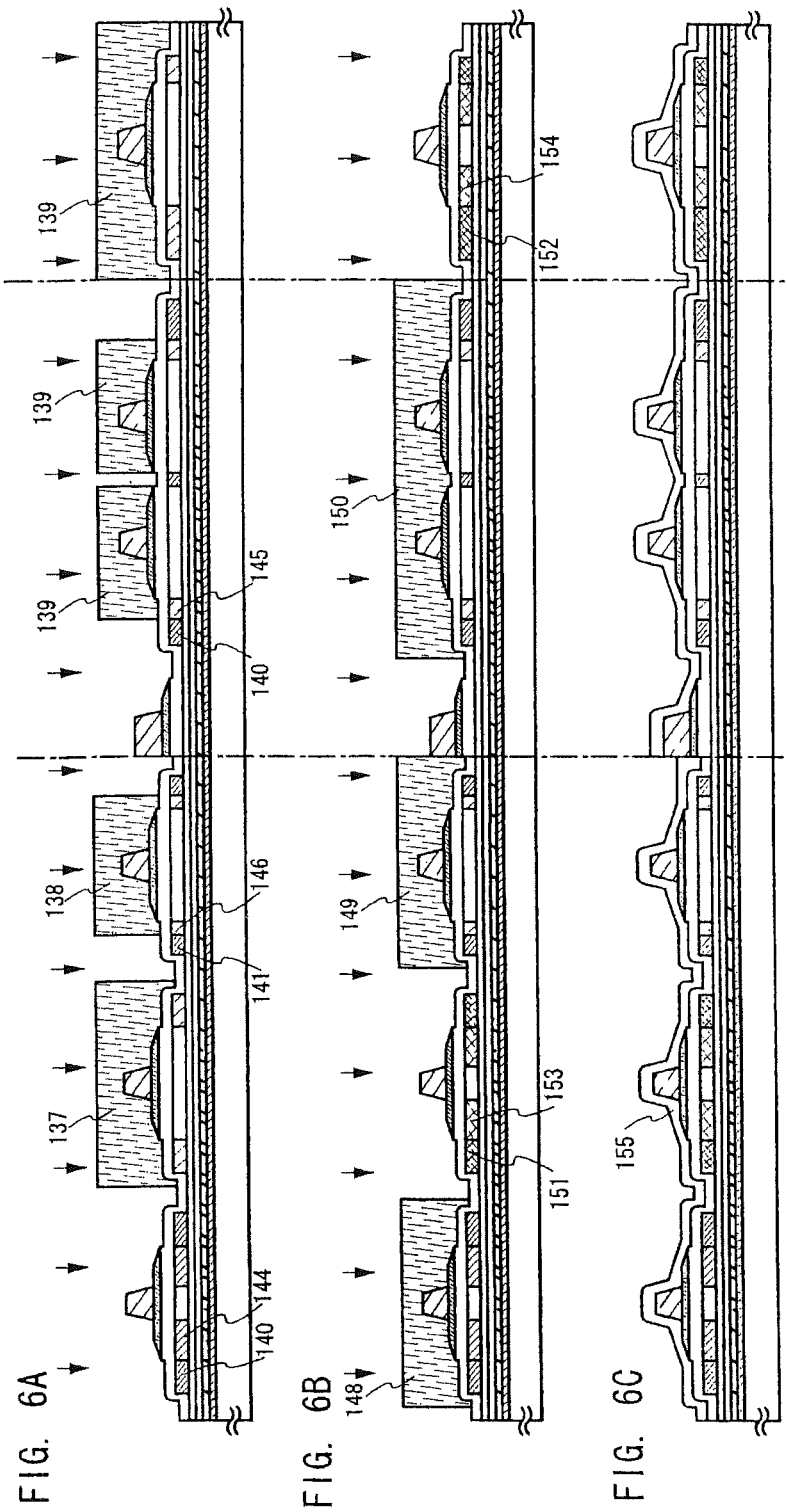

DRIVING CIRCUIT 413 | PIXEL PORTION 414

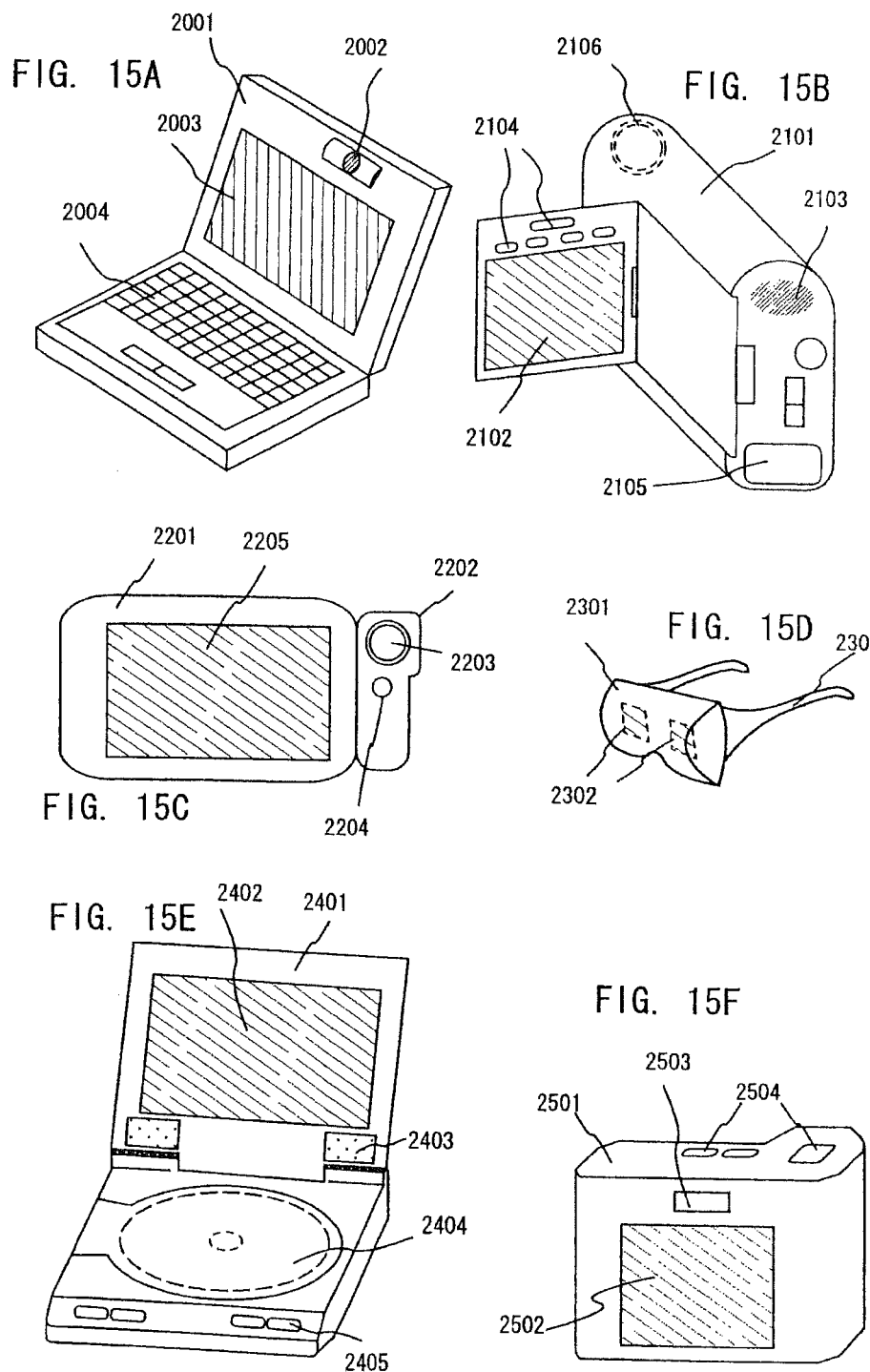

PEELING METHOD AND METHOD OF MANUFACTURING SEMICONDUCTOR DEVICE

CROSS-REFERENCE TO RELATED APPLICATIONS

This application is a divisional of U.S. application Ser. No. 15/059,623, filed Mar. 3, 2016, which is a continuation of U.S. application Ser. No. 14/207,759, filed Mar. 13, 2014, now U.S. Pat. No. 9,281,403, which is a divisional of U.S. application Ser. No. 13/466,212, filed May 8, 2012, now U.S. Pat. No. 8,674,364, which is a continuation of U.S. application Ser. No. 12/477,966, filed Jun. 4, 2009, now U.S. Pat. No. 8,338,198, which is a continuation of U.S. application Ser. No. 12/016,274, filed Jan. 18, 2008, now U.S. Pat. No. 7,825,002, which is a continuation of U.S. application Ser. No. 10/218,042, filed Aug. 14, 2002, now U.S. Pat. No. 7,351,300, which claims the benefit of a foreign priority application filed in Japan as Serial No. 2001-251870 on Aug. 22, 2001, all of which are incorporated by reference.

BACKGROUND OF THE INVENTION

1. Field of the Invention

The present invention relates to a semiconductor device having a circuit composed of thin film transistors (hereinafter referred to as TFTs) and a manufacturing method thereof. The present invention relates to an electro-optical device which is represented by, for example, a liquid crystal display panel and an electronic device on which such an electro-optical device is mounted as a part.

Note that a semiconductor device in this specification indicates a general device functioning by utilizing semiconductor characteristics, which includes an electro-optical device, a light emitting device, a semiconductor circuit, and an electronic device.

2. Description of the Related Art

In recent years, a technique of constructing a thin film transistor (TFT) using a semiconductor thin film (about several to several hundred nm in thickness) formed on a substrate having an insulating surface has drawn attention. The thin film transistor is widely applied to an electronic device such as an IC or an electro-optical device. In particular, the development for the thin film transistor as a switching element of an image display device is urgently necessary.

Various applications utilizing such an image display device are expected, and particularly the utilization to a mobile device is noted. Currently, a glass substrate or a quartz substrate is used for forming the TFT in many cases. However, there is a defect that they are easy to crack and heavy. In addition, in the case of mass production, it is difficult to use a large scale glass substrate or quartz substrate and these substrates are not suitable. Thus, it is attempted to form a TFT element on a flexible substrate, typically, a flexible plastic film.

However, the plastic film has a low heat resistance, so that it is necessary to reduce a maximum temperature of a process. As a result, under the current circumstances, a TFT having a preferable electrical characteristic cannot be formed on the plastic film as compared with the case where the glass substrate is used. Therefore, a high performance liquid crystal display device and light emitting element with the plastic film are not realized.

Also, a peeling method of peeling a layer to be peeled which is located over a substrate through a separate layer, from the substrate has already been proposed. According to the technique described in, for example, JP 10-125929 A or JP 10-125931 A, the separate layer made of amorphous silicon (or polysilicon) is provided on the substrate, and laser light is irradiated thereto through the substrate to release hydrogen contained in the amorphous silicon. As a result, gaps are produced in the separate layer, thereby separating the layer to be peeled from the substrate. In addition, according to JP 10-125930 A, it is described that a layer to be peeled (which is called a layer to be transferred in this document) is bonded to a plastic film to complete a liquid crystal display device using the above technique.

However, according to the above method, it is essential to use substrate having high transparent property. In addition, it is necessary to perform a laser light irradiation with relatively high energy enough to transmit laser light through the substrate and to release hydrogen contained in the amorphous silicon. Thus, there is a problem in that the layer to be peeled is damaged. Further, according to the above method, in the case where an element is manufactured on the separate layer, when, for example, heat treatment with a high temperature is performed in an element manufacturing process, hydrogen contained in the separate layer is diffused to reduce the concentration thereof. Thus, even when the laser light is irradiated to the separate layer, there is a possibility that peeling is not sufficiently performed. Therefore, when the amount of hydrogen contained in the separate layer is kept, there is a problem in that a process performed after the formation of the separate layer is limited. Furthermore, in the above document, it is described that a light shielding layer or a reflective layer is provided to prevent the damage to the layer to be peeled. However, in this case, it is difficult to manufacture a transmission liquid crystal display device. In addition, in the above method, it is difficult to peel the layer to be peeled having a large area.

Also, according to a conventional peeling method, a thin film is used as a layer for producing a peeling phenomenon (separate layer or the like). Thus, when nonuniformity of a film thickness is caused in the substrate, contact property between the separate layer and the substrate becomes nonuniform and poor peeling such as insufficient peeling or cracking in a substrate is easily caused at the time of peeling.

SUMMARY OF THE INVENTION

The present invention has been made in view of the above problems. An object of the present invention is therefore to provide a peeling method in which a layer to be peeled is not damaged and not only a layer to be peeled having a small area but also a layer to be peeled having a large area can be peeled without causing poor peeling over the entire surface.

Also, an object of the present invention is to provided a peeling method which is not limited by a heat treatment temperature, a kind of substrate, and the like at the formation of the layer to be peeled.

Also, an object of the present invention is to provide a semiconductor device in which the layer to be peeled is bonded to various base members to reduce its weight and a manufacturing method thereof. Particularly, an object of the present invention is to provide a semiconductor device in which various elements (thin film diode, a photoelectric conversion element having a silicon PIN junction (solar battery, a sensor, or the like), and a silicon resistance element) represented by a TFT are bonded to a flexible film to reduce its weight and a manufacturing method thereof.

The present inventors conducted a number of tests and discussions. A first material layer is provided on a substrate and a second material layer is provided in contact with the first material layer. Then, a film is formed on the second material layer or heat treatment is performed at 500° C. or higher thereon, and internal stresses of the respective films are measured. As a result, the first material layer has tensile stress and the second material layer has compression stress. With respect to a laminate of the first material layer and the second material layer, a trouble, such as film peeling is not caused in a process. In addition, clean separation can be easily performed in an inner portion of the second material layer or at an interface thereof by physical means, typically, the application of mechanical force, for example, peeling by the hand of a person.

That is, bonding force between the first material layer and the second material layer has a sufficient strength to be resistant to separation by heat energy. However, there is stress distortion between the first material layer having tensile stress and the second material layer having compression stress immediately before peeling. Thus, the laminate of the first material layer and the second material layer is sensitive to mechanical energy, thereby causing peeling. The present inventors found that a peeling phenomenon is deeply relevant to internal stress of a film. Thus, a peeling process of conducting peeling by utilizing the internal stress of the film is called a stress peel off process.

Also, it is important to make a lead such that a peeling phenomenon is easy to occur before peeling. Thus, preprocessing for selectively (partially) reducing the contact property is performed, thereby preventing poor peeling and further improving a yield.

That is, the following is considered. A region having a small film thickness is easy to form in an outer edge of a substrate as compared with a central region thereof. If the film thickness is small, a region having high contact property to the substrate is produced. Thus, a film in such a region becomes resistant to peeling. Only the vicinity of the outer edge of the substrate with the high contact property is scanned with laser light. Or, a needle is vertically pressed against the thin film and a load is applied to the needle. With this state, the needle is moved along the outer edge of the substrate to scratch it, and then peeling is conducted. Therefore, insufficient peeling can be prevented.

Also, it is desirable that peeling is started from the vicinity of the region for which the above preprocessing is performed.

Also, when the above preprocessing is performed before peeling, the insufficient peeling is prevented and the material layers which are not peeled can be peeled. That is, it is possible that a margin with respect to the first material layer or the second material layer, for example, the variety of materials is increased and a range of the film thicknesses is extended.

According to a constitution of the present invention relating to a peeling method disclosed in this specification, there is provided a peeling method of peeling a layer to be peeled from a substrate, characterized by comprising:

providing a first material layer on the substrate, and forming a layer to be peeled which is composed of a laminate including at least a second material layer which is in contact with the first material layer, over the substrate to which the first material layer is provided;

performing processing for partially reducing contact property between the first material layer and the second material layer; and then peeling the layer to be peeled from the substrate to which the first material layer is provided by physical means at one of an inner portion and an interface of the second material layer.

Also, according to the above constitution, the first material layer is characterized by having tensile stress of 1 $dyne/cm^2$ to $1 \times 10^{10}$ $dyne/cm^2$. As long as a material having tensile stress of the above range is used, it is not particularly limited. Thus, a layer made of any one of a metallic material (Ti, Al, Ta, W, Mo, Cu, Cr, Nd, Fe, Ni, Co, Zr, Zn, Ru, Rh, Pd, Os, Ir, Pt, or the like), a semiconductor material (for example, Si or Ge), an insulating material, and an organic material, or a laminate of these materials can be used for the first material layer. Note that, when heat treatment is performed for a film having tensile stress larger than 1 $dyne/cm^2$ to $1 \times 10^{10}$ $dyne/cm^2$, peeling is easy to occur.

Also, according to the above constitution, the second material layer is characterized by having compression stress of $-1$ $dyne/cm^2$ to $-1 \times 10^{10}$ $dyne/cm^2$. When a material having compression stress of the above range is used, it is particularly not limited. Thus, a layer made of any one of a metallic material (Ti, Al, Ta, W, Mo, Cu, Cr, Nd, Fe, Ni, Co, Zr, Zn, Ru, Rh, Pd, Os, Ir, Pt, and the like), a semiconductor material (for example, Si or Ge) an insulating material, and an organic material, or a laminate of these materials can be used for the second material layer. Note that, when heat treatment is performed for a film having compression stress larger than $-1 \times 10^{10}$ $dyne/cm^2$, peeling is easy to occur.

Also, even if compression stress is produced immediately after formation, a material having tensile stress at a state immediately before peeling can be used for the first material layer.

Also, according to the above constitution, another layer, for example, an insulating layer or a metallic layer may be provided between the substrate and the first material layer to improve the contact property. In order to simplify a process, it is preferable that the first material layer is formed on the substrate.

Also, according to the above constitution, in order to promote peeling, heat treatment or laser light irradiation may be conducted after bonding of the support. In this case, a material which absorbs laser light may be selected for the first material layer and the first material layer is heated to change internal stress of the film, thereby being easy to peel. When laser light is utilized, a transparent substrate is used.

Note that the physical means in this specification is means understood not in chemistry but in physics, specifically indicates dynamic means or mechanical means having a process which can be replaced by a dynamic law, and indicates means for changing some dynamic energy (mechanical energy).

Also, peeling may be performed after a support is bonded through bonding layer. According to another constitution of the present invention relating to a peeling method disclosed in this specification, there is provided a peeling method of peeling a layer to be peeled from a substrate, characterized by comprising:

providing a first material layer on the substrate and forming a layer to be peeled which is composed of a laminate including at least a second material layer which is in contact with the first material layer, over the substrate to which the first material layer is provided;

performing processing for partially reducing contact property between the first material layer and the second material layer;

then bonding a support to the layer to be peeled; and peeling the layer to be peeled to which the support is bonded from the substrate to which the first material layer is provided by physical means at one of an inner portion and an interface of the second material layer.

Also, according to the above constitutions, the method is characterized in that the peeling by the physical means is conducted from a region for which the processing for reducing the contact property is performed.

Also, according to the above constitutions, the method is characterized in that the processing for partially reducing the contact property is the processing for partially irradiating laser light to one of the first material layer and the second material layer along an outer edge of the substrate, or the processing for locally applying a pressure from external along the outer edge of the substrate to damage an inner portion of the second material layer or a portion of an interface thereof.

Also, according to the present invention, not only a transparent substrate but also all substrates, for example, a glass substrate, a quartz substrate, a semiconductor substrate, a ceramic substrate, and a metallic substrate can be used and the layer to be peeled which is provided over the substrate can be peeled.

Also, when the processing for partially reducing the contact property according to the present invention is performed before peeling using a known peeling method, the layer to be peeled provided which is over the substrate can be bonded (transferred) to a transfer body to manufacture a semiconductor device. A method of manufacturing a semiconductor device according to the present invention includes the steps of:

forming a layer to be peeled which includes an element on a substrate;

bonding a support to the layer to be peeled which includes the element and then peeling the support from the substrate by physical means; and bonding a transfer body to the layer to be peeled which includes the element to sandwich the element between the support and the transfer body, characterized in that processing for partially reducing contact property between the substrate and the layer to be peeled is performed before the peeling.

Also, according to the above constitution, the peeling by the physical means is produced from a region for which the processing for reducing the contact property is performed.

Also, according to the above constitution, the processing for partially reducing the contact property is the processing for partially irradiating laser light to the first material layer or the second material layer along the outer edge of the substrate, or the processing for locally applying a pressure from external along the outer edge of the substrate to damage an inner portion of the second material layer or a portion of an interface thereof.

Also, according to the above constitution, the peeling by the physical means may be conducted by blowing a gas onto an end surface of the substrate.

Also, according to the above constitution, the peeling by the physical means may be conducted by blowing a gas onto an end surface of the substrate together with irradiation of laser light.

Also, according to the above constitution, the peeling by the physical means may be conducted by blowing the gas onto the end surface of the substrate together with scanning using the laser light from the region for which the processing for reducing the contact property is performed.

Also, according to the above respective constitutions, a heated gas may be used, and it is preferable that the gas is an inert gas, typically, a nitrogen gas.

Also, according to the above respective constitutions with respect to the method of manufacturing the semiconductor device, the element is a thin film transistor using a semiconductor layer as an active layer. The semiconductor layer is characterized by being a semiconductor layer having a crystalline structure which obtained by crystallizing a semiconductor having an amorphous structure by heat treatment or laser light irradiation processing.

Note that the transfer body in this specification is bonded to the layer to be peeled after peeling, is not particularly limited, and may be a base member made of any composition such as plastic, glass, metal, or ceramics. In addition, the support in this specification is bonded to the layer to be peeled at peeling by the physical means, is not particularly limited, and may be a base member made of any composition such as plastic, glass, metal, or ceramics. In addition, the shape of the transfer body and the shape of the support are not particularly limited, they may have a flat surface or a curved surface, may be flexible, or may be formed in a film shape. In addition, when weight reduction is the highest priority, a film-shaped plastic substrate, for example, a plastic substrate made of polyethylene terephthalate (PET), polyether sulfone (PES), polyethylene naphthalate (PEN), polycarbonate (PC), nylon, polyether etherketone (PEEK), polysulfone (PSF), polyether imide (PEI), polyallylate (PAR), polybutylene terephthalate (PBT), or the like is preferable.

According to the above respective constitutions with respect to the method of manufacturing the semiconductor device, when a liquid crystal display device is manufactured, it is preferable that the support is used as a counter substrate and bonded to the layer to be peeled using a sealing member as a bonding layer. In this case, the element provided to the layer to be peeled has a pixel electrode. A liquid crystal material is filled into a space between the pixel electrode and the counter substrate.

Also, according to the above respective constitutions with respect to the method of manufacturing the semiconductor device, when a light emitting device represented by an EL light emitting device is manufactured, it is preferable that the support is used as a sealing member. Thus, a light emitting element is completely shielded from external so as to prevent entrance of a substance such as moisture or oxygen which promotes deterioration of an organic compound layer from external. In addition, when weight reduction is the highest priority, a film-shaped plastic substrate is preferable. However, an effect for preventing entrance of a substance such as moisture or oxygen which promotes deterioration of an organic compound layer from external is small. Thus, for example, a single layer made of a material selected from aluminum nitride (AlN), aluminum nitride oxide ($AlN_XO_Y$ (X>Y)), aluminum oxynitride ($AlN_XO_Y$ (X<Y)), aluminum oxide ($Al_2O_3$), and beryllium oxide (BeO), or a laminate of those is preferably provided to the support which is the plastic substrate to obtain a structure for sufficiently preventing entrance of a substance such as moisture or oxygen which promotes deterioration of an organic compound layer from external. Note that, when aluminum nitride oxide ($AlN_XO_Y$ (X>Y)) is used, it is desirable that a concentration of nitrogen contained in the film is 10 atoms % to 80 atoms %.

Also, when the light emitting device represented by the EL light emitting device is manufactured, as in the case of the support, it is preferable that a single layer made of a material selected from aluminum nitride (AlN), aluminum nitride oxide (AlN$_X$O$_Y$ (X>Y)), aluminum oxynitride (AlN$_X$O$_Y$ (X<Y)), aluminum oxide (Al$_2$O$_3$), and beryllium oxide (BeO), or a laminate of those is preferably provided to the transfer body which is the plastic substrate to sufficiently prevent entrance of a substance such as moisture or oxygen which promotes deterioration of an organic compound layer from external. In addition, those films have very high transparent property and thus do not hinder light emission by a light emitting element.

Note that the internal stress of the film in this specification indicates, in the case where an arbitrary section is assumed in an inner portion of a film formed on a substrate, stress per unit section which is exerted from one side of the section to the other side thereof. It can be said that the internal stress is necessarily produced more or less in a thin film formed by vacuum evaporation, sputtering, vapor phase growth, or the like. The maximum value reaches $10^9$ N/m$^2$. The internal stress value is changed depending on a material of a thin film, a substance composing a substrate, a formation condition of the thin film, and the like. In addition, the internal stress value is also changed by heat treatment.

Also, a state in the case where a direction of stress exerted on a counter through a unit section perpendicular to the surface of a substrate is a tensile direction is a tensile state and internal stress at this state is called tensile stress. In addition, a state in the case where the direction of the stress is a pressing direction is a compression state and internal stress at this state is called compression stress. Note that, in the cases of a graph and a table in this specification, the tensile stress is indicated to be positive (+) and the compression tensile is indicated to be negative (−).

BRIEF DESCRIPTION OF THE DRAWINGS

In the accompanying drawings:

FIGS. 5A to 5D are sectional views showing steps of manufacturing an active matrix substrate;

FIGS. 6A to 6C are sectional views showing steps of manufacturing the active matrix substrate;

FIGS. 15A to 15F show examples of electronic devices;

DETAILED DESCRIPTION OF THE PREFERRED EMBODIMENTS

Embodiment modes of the present invention will be described below.

Embodiment Mode 1

Hereinafter, a typical peeling order according to the present invention will be briefly described using FIGS. 1A to 1D.

Figure 1A:
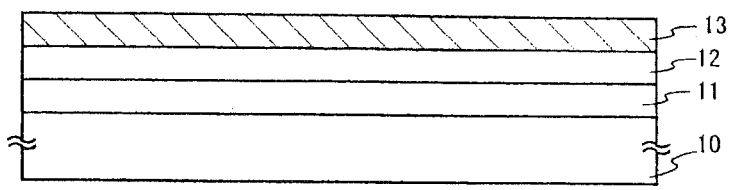
FIGS. 1A to 1D are explanatory views of Embodiment Mode 1.

In FIG. 1A, reference numeral 10 denotes a substrate, 11 denotes a first material layer having tensile stress, 12 denotes a second material layer having compression stress, and 13 denotes a layer to be peeled.

In FIG. 1A, a glass substrate, a quartz substrate, a ceramic substrate, or the like can be used as the substrate 10. In addition, a silicon substrate, a metallic substrate, or a stainless steel substrate may be alternatively used.

First, as shown in FIG. 1A, the first material layer 11 is formed on the substrate 10. The first material layer 11 may have compression stress or tensile stress immediately after the formation. It is important that the first material layer is formed from a material with which a trouble such as peeling is not caused by heat treatment or laser light irradiation at the formation of the layer to be peeled and which has tensile stress at a range of 1 dyne/cm$^2$ to $1 \times 10^{10}$ dyne/cm$^2$ immediately after the formation of the layer to be peeled. As a typical example, there is a single layer which is made of an element selected from W, WN, TiN, and TiW, or an alloy material or a compound material which contains mainly the element, or a laminate thereof.

Next, the second material layer 12 is formed on the first material layer 11. It is important that the second material layer 12 is formed from a material with which a trouble such as peeling is not caused by heat treatment or laser light irradiation at the formation of the layer to be peeled and which has compression stress at a range of 1 dyne/cm$^2$ to $1 \times 10^{10}$ dyne/cm$^2$ immediately after the formation of the layer to be peeled. As a typical example for the second material layer 12, there is silicon oxide, silicon oxynitride, a metallic oxide material, or a laminate of those. Note that the second material layer 12 may be formed by using any film formation method such as a sputtering method, a plasma CVD method, or an applying method.

In the present invention, it is important to produce compression stress in the second material layer 12 and produce tensile stress in the first material layer 11. Respective film thicknesses are preferably set to 1 nm to 1000 nm as appropriate to adjust internal stress of the first material layer 11 and that of the second material layer 12. In addition, the internal stress of the first material layer 11 and that of the second material layer 12 may be adjusted by heat treatment or laser light irradiation.

Also, for a simplification of a process, an example in which the first material layer 11 is formed in contact with the substrate 10 is shown in FIGS. 1A to 1D. An insulating layer or a metallic layer as a buffer layer may be provided between the substrate 10 and the first material layer 11 to improve contact property to the substrate 10.

Next, the layer to be peeled 13 is formed on the second material layer 12 (FIG. 1A). The layer to be peeled 13 is preferably a layer including various elements (thin film diode, photoelectric conversion element having a silicon PIN junction, and silicon resistor element) represented by a TFT. In addition, heat treatment can be performed as long as the substrate 10 can endure. Note that, even if the internal stress of the second material layer 12 is different from that of the first material layer 11 in the present invention, film peeling and the like are not caused by heat treatment in a step of forming the layer to be peeled 13.

Figure 1B:
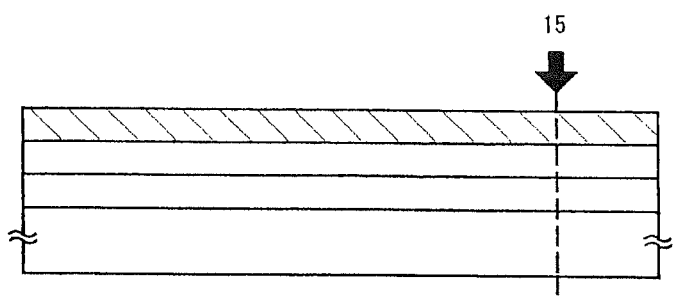

Next, contact property between the first material layer 11 and the second material layer 12 is partially reduced. Here, irradiation of laser light 15 is conducted (FIG. 1B). For the laser light, a gas laser such as an excimer laser, a $CO_2$ laser, or an argon laser, a solid laser such as a glass laser, a ruby laser, an alexandrite laser, or a Ti:sapphire laser, a solid laser using crystal such as YAG, $YVO_4$, YLF, or $YAlO_3$ which is doped with Nd, Tm, or Ho, or a semiconductor laser is preferably used. In addition, a laser oscillation type may be either continuous oscillation or pulse oscillation. A laser beam may have a linear shape, a rectangular shape, a circular shape, or an elliptical shape. A wavelength to be used may be a fundamental wave, the second harmonic, or the third harmonic, and is preferably selected as appropriate by an operator. A scanning direction may be a longitudinal direction, a transverse direction, or an oblique direction. Further, round trip scanning may be conducted.

Thus, it is important to prepare a portion where a peeling phenomenon is easy to occur before peeling, that is, a lead. When preprocessing is performed for selectively (partially) reducing the contact property, poor peeling is prevented and a yield is improved as well.

Figure 1C:
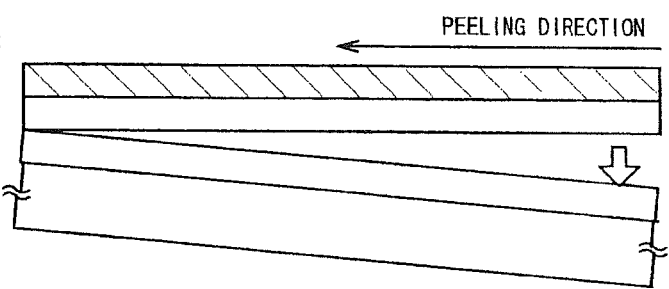

Next, peeling is conducted from a region to which the laser light is irradiated, thereby peeling the substrate 10 on which the first material layer 11 is provided toward a direction indicated by an arrow in FIG. 1C by physical means (FIG. 1C).

The second material layer 12 has compression stress and the first material layer 11 has tensile stress. Thus, the substrate can be peeled by relatively small force (for example, by the hand of a person, by a blowing pressure of a gas blown from a nozzle, by ultrasound, or the like). In addition, a portion having small contact property is partially formed by the above laser light processing. Thus, the substrate can be peeled by smaller force.

Also, the example is shown under an assumption in which the layer to be peeled 13 has a sufficient mechanical strength here. When the mechanical strength of the layer to be peeled 13 is insufficient, it is preferable that the substrate is peeled after a support (not shown) for fixing the layer to be peeled 13 is bonded thereto.

Figure 1D:
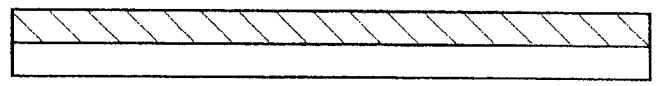

Thus, the layer to be peeled 13 formed on the second material layer 12 can be separated from the substrate 10. A state obtained after peeling is shown in FIG. 1D.

Also, the separated layer to be peeled 13 may be bonded to a transfer body (not shown) after peeling.

Also, the present invention can be applied to various semiconductor device manufacturing methods. Particularly, when a plastic substrate is used for the transfer body and the support, weight reduction is realized.

When a liquid crystal display device is manufactured, it is preferable that the support is used as a counter substrate and bonded to the layer to be peeled using a sealing member as a bonding layer. In this case, the element provided to the layer to be peeled has a pixel electrode. A liquid crystal material is filled into a space between the pixel electrode and the counter substrate. In addition, an order for manufacturing the liquid crystal display device is not particularly limited. For example, the counter substrate as the support is bonded to the layer to be peeled which is provided to the substrate, a liquid crystal material is injected therebetween, and then the substrate is peeled and the plastic substrate as the transfer body is bonded to the layer to be peeled. Or, after the pixel electrode is formed, the substrate is peeled, the plastic substrate as a first transfer body is boned to the layer to be peeled, and then the counter substrate as a second transfer body is bonded thereto.

Also, when a light emitting device represented by an EL light emitting device is manufactured, it is preferable that the support is used as a sealing member. Thus, a light emitting element is completely shielded from external so as to prevent entrance of a substance such as moisture or oxygen which promotes deterioration of an organic compound layer from external. In addition, when the light emitting device represented by the EL light emitting device is manufactured, as in the case of the support, it is preferred to prevent entrance of a substance such as moisture or oxygen which promotes deterioration of an organic compound layer from external. In addition, an order for manufacturing the light emitting device is not particularly limited. For example, after the light emitting element is formed, a plastic substrate as the support is bonded to the layer to be peeled which is provided to a substrate, the substrate is peeled, and a plastic substrate as the transfer body is bonded to the layer to be peeled. Or, after the light emitting element is formed, the substrate is peeled, a plastic substrate as a first transfer body is boned to the layer to be peeled, and then a plastic substrate as a second transfer body is bonded thereto.

Embodiment Mode 2

Figure 2A:
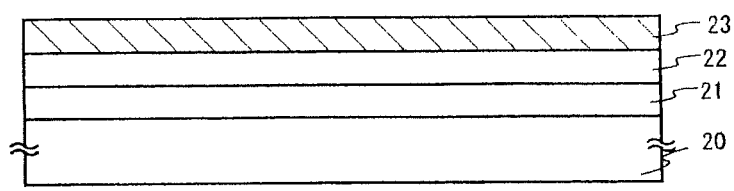
FIGS. 2A to 2C are explanatory views of Embodiment Mode 2.
Figure 2B:
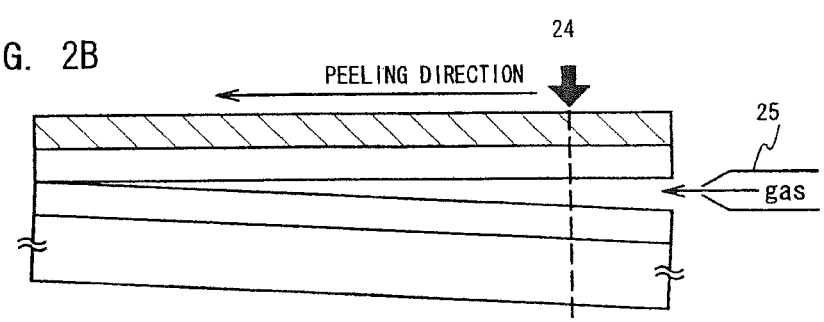
Figure 2C:

In this embodiment mode, an example in which a layer to be peeled is peeled while a gas is blown onto an end surface thereof will be briefly described using FIGS. 2A to 2C.

In FIG. 2A, reference numeral 20 denotes a substrate, 21 denotes a first material layer having tensile stress, 22 denotes a second material layer having compression stress, and 23 denotes a layer to be peeled. Note that FIG. 2A is the same drawing as FIG. 1A and detailed descriptions are omitted here.

After the state shown in FIG. 2A is obtained by the same order as Embodiment Mode 1, as shown in FIG. 2B, while laser light 24 is irradiated to a portion, a gas is blown at a high pressure from a nozzle 25 to an interface between the first material layer and the second material layer within an end surface of the substrate, thereby conducting peeling in a direction indicated by an arrow in FIG. 2B.

Here, a wind pressure is used as physical means. However, it is needless to say that the physical means is not particularly limited. In addition, the example in which peeling by a wind pressure is conducted simultaneously with the irradiation of the laser light 24 is shown here. The laser light irradiation may be initially performed to partially reduce the contact property between the first material layer 21 and the second material layer 22 and then peeling may be conducted by a wind pressure.

Also, an inert gas such as, for example, a nitrogen gas or an argon gas is preferably used as the gas to be blown. The gas may be used under a room temperature or heated to a high temperature.

Also, laser light 24 may be irradiated for scanning along a peeling direction. In addition, the nozzle 25 may be moved.

The second material layer 22 has compression stress and the first material layer 21 has tensile stress. Thus, the layer to be peeled can be peeled by a relatively small wind pressure. In addition, a portion having small contact property is partially formed by the above laser light processing. Thus, the layer to be peeled can be peeled by a smaller wind pressure.

Also, the example is shown under an assumption in which the layer to be peeled 23 has a sufficient mechanical strength is assumed is indicated here. When the mechanical strength of the layer to be peeled 23 is insufficient, it is preferable that a support (not shown) for fixing the layer to be peeled 23 is bonded thereto and then it is peeled.

Thus, the layer to be peeled 23 formed on the second material layer 22 can be separated from the substrate 20. A state obtained after peeling is shown in FIG. 2C.

Also, the separated layer to be peeled 23 may be bonded to a transfer body (not shown) after peeling.

Also, the present invention can be applied to various semiconductor device manufacturing methods. Particularly, when a plastic substrate is used for the transfer body and the support, weight reduction is realized.

Embodiment Mode 3

In this embodiment mode, an example in which a pressure is applied to a layer to be peeled by a diamond pen before peeling to partially reduce contact property will be briefly described using FIGS. 3A to 3D.

Figure 3A:
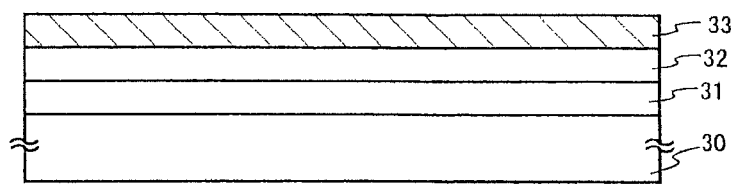
FIGS. 3A to 3D are explanatory views of Embodiment Mode 3.

In FIG. 3A, reference numeral 30 denotes a substrate, 31 denotes a first material layer having tensile stress, 32 denotes a second material layer having compression stress, and 33 denotes a layer to be peeled. Note that FIG. 3A is the same drawing as FIG. 1A and detailed descriptions are omitted here.

Figure 3B:
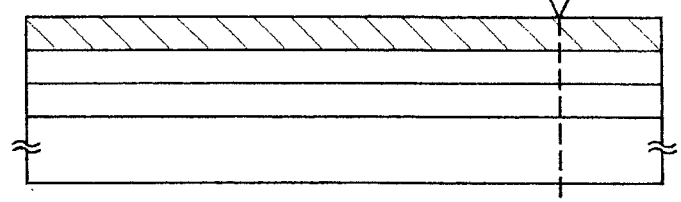

After the state shown in FIG. 3A is obtained by the same order as Embodiment Mode 1, as shown in FIG. 3B, external force 35 is applied to a pen 34 to scratch the layer to be peeled, thereby partially reducing the contact property between the first material layer 31 and the second material layer 32. The diamond pen is used here. Preferably, a hard needle is vertically pressed and moved under a load.

Thus, it is important to prepare a portion where a peeling phenomenon is easy to occur before peeling, that is, a lead. When preprocessing is performed for selectively (partially) reducing the contact property, poor peeling is prevented and a yield is improved as well.

Figure 3C:
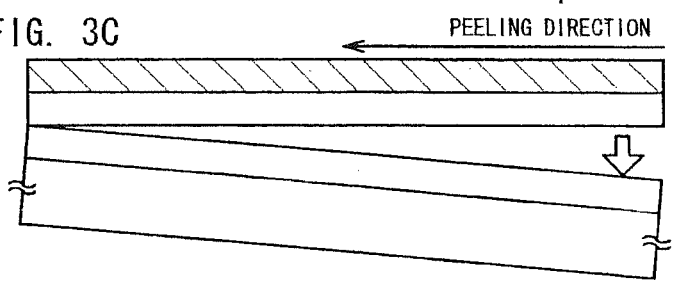

Next, peeling is conducted from a region to which the load is applied, thereby peeling the substrate 30 on which the first material layer 31 is provided toward a direction indicated by an arrow in FIG. 3C by physical means (FIG. 3C).

The second material layer 32 has compression stress and the first material layer 31 has tensile stress. Thus, the substrate can be peeled by relatively small force. In addition, a portion having small contact property is partially formed by the above laser light processing. Thus, the substrate can be peeled by smaller force.

Also, the example is shown under an assumption in which the layer to be peeled 33 has a sufficient mechanical strength is assumed is indicated here. When the mechanical strength of the layer to be peeled 33 is insufficient, it is preferable that the substrate is peeled after a support (not shown) for fixing the layer to be peeled 33 is bonded thereto.

Figure 3D:
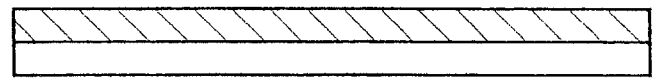

Thus, the layer to be peeled 33 formed on the second material layer 32 can be separated from the substrate 30. A state obtained after peeling is shown in FIG. 3D.

Also, the separated layer to be peeled 33 may be bonded to a transfer body (not shown) after peeling.

Also, the present invention can be applied to various semiconductor device manufacturing methods. Particularly, when a plastic substrate is used for the transfer body and the support, weight reduction is realized.

Also, the following test is conducted using the diamond pen. Here, a TiN film is used as the first material layer and an $SiO_2$ film is used as the second material layer.

In order to obtain a sample, a TiN film having a film thickness of 100 nm is formed on a glass substrate by a sputtering method and then a silicon oxide film having a film thickness of 200 nm is formed by a sputtering method.

Next, a silicon oxide layer is formed at a film thickness of 200 nm by a sputtering method. With respect to a film formation condition for the silicon oxide layer, an RF type sputtering apparatus and a silicon oxide target (30.5 cm in diameter) are used. In addition, a substrate temperature is set to 150° C., a film formation pressure is set to 0.4 Pa, film formation power is set to 3 kW, and argon flow rate/oxygen flow rate=35 sccm/15 sccm.

Next, a base insulating layer is formed on the silicon oxide layer 33 by a plasma CVD method. With respect to the base insulating layer, a silicon oxynitride film (composition ratio: Si=32%, O=27%, N=24%, and H=17%) having a film thickness of 50 nm is formed at a film formation temperature of 300° C. by a plasma CVD method using $SiH_4$, $NH_3$, and $N_2O$ as raw gases. The surface is washed with ozone water and then an oxide film produced on the surface is removed with diluted hydrofluoric acid (1/100 dilution). Then, a silicon oxynitride film (composition ratio: Si=32%, O=59%, N=7%, and H=2%) having a thickness of 100 nm is laminated at a film formation temperature of 300° C. by a plasma CVD method using $SiH_4$ and $N_2O$ as raw gases. Further, a semiconductor layer having an amorphous structure (here, an amorphous silicon layer) with a thickness of 54 nm is formed at a film formation temperature of 300° C. by a plasma CVD method using $SiH_4$ as a film formation gas without exposing it to air.

Next, a nickel acetate solution containing nickel at 10 ppm in weight conversion is applied onto the entire surface by spinner. A method of spraying nickel elements over the entire surface by a sputtering method may be used instead of the application. Then, heat treatment is performed for crystallization to form a semiconductor film having a crystalline structure (here, a polysilicon layer). Here, heat treatment for dehydrogenation (at 500° C. for 1 hour) is performed and then the heat treatment for crystallization (at 550° C. for 4 hours) is performed to obtain a silicon film having a crystalline structure. Note that a crystallization technique using nickel as a metallic element for promoting crystallization of silicon is utilized here. Another known crystallization technique such as, for example, a solid phase method or a laser crystallization method may be used.

Figure 4A:
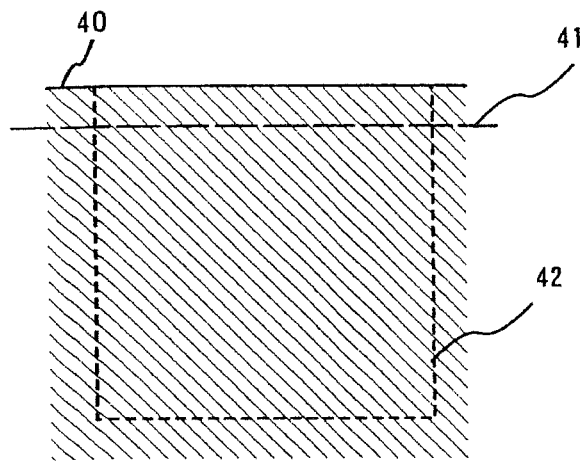
FIGS. 4A to 4C are explanatory views of a test.

Next, a load line 41 shown in FIG. 4A is scratched by the diamond pen. The load line is arbitrary and set to be parallel to the end surface 40 of the substrate within a region to be peeled 42. Here, a portion of the polysilicon layer provided to the substrate, which is located in contact with the end surface thereof, is peeled.

Next, a bonding tape is bonded to the region to be peeled (polysilicon layer).

Figure 4B:
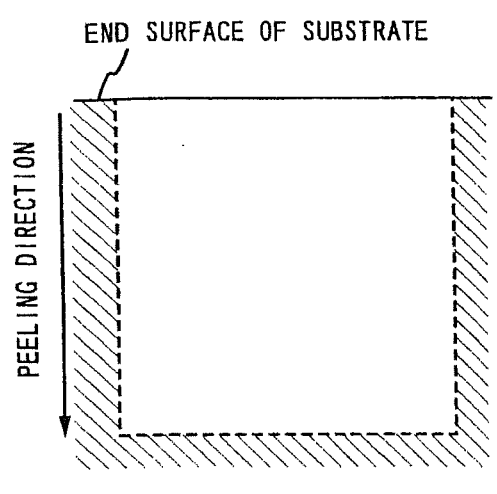
Figure 4C:
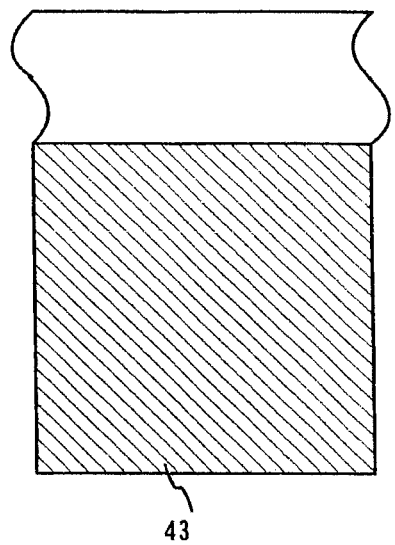

Next, tension is produced by the hand of a person in a direction indicated by an arrow (peeling direction) in FIG. 4B so as to separate the bonding tape from the substrate. A state of the substrate which is obtained after peeling is shown in FIG. 4B and a state of the tape which is obtained after peeling shown in FIG. 4C. A peeled region 43 can be visibly observed in the tape.

Figure 17A:
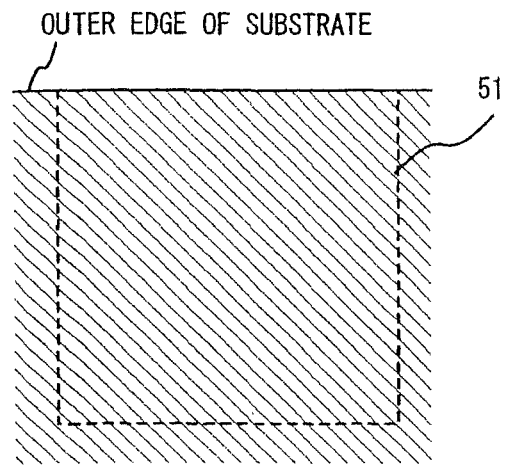
FIGS. 17A to 17C are explanatory views of a comparison example in a test.
Figure 17B:
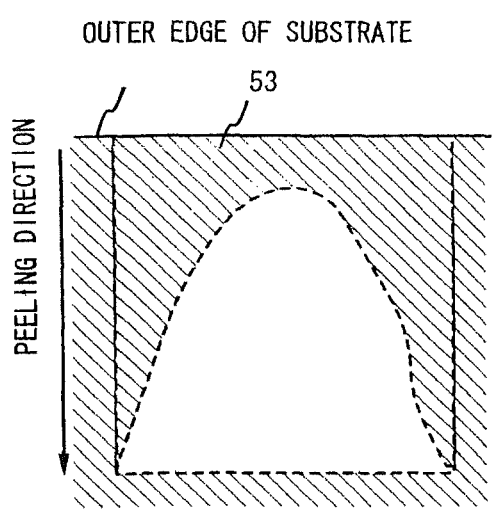
Figure 17C:
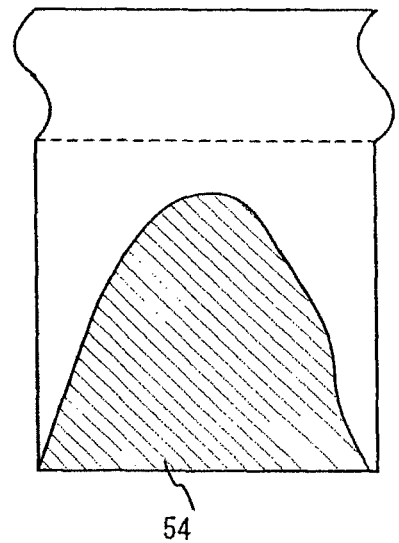

For comparison, the bonding tape is boned without scratching by the diamond pen and then peeling is conducted. As a result, as shown in FIG. 17A, even when the bonding tape is bonded to a region to be peeled 51, a region 53 (FIG. 17B) left without being peeled is produced on the substrate. Thus, as shown in FIG. 17C, a peeled region 54 is partially produced in the tape, thereby causing poor peeling.

The cause of poor peeling is considered as follows. That is, as compared with a central region of the substrate, a portion having a small film thickness is easy to form in the outer edge thereof. If the film thickness is small, a portion having high contact property to the substrate is formed and becomes hard to peel.

Thus, it is important to prepare a lead such that a peeling phenomenon is easy to occur before peeling. When preprocessing for selectively (partially) reducing the contact property is performed, the layer to be peeled can be peeled over the entire surface from the substrate.

Here, scratching is conducted by the diamond pen before bonding of the bonding tape. Scratching may be conducted by the diamond pen after bonding of the tape.

Also, the example is shown in which peeling is conducted using the first material layer (TiN layer) and the second material layer ($SiO_2$ layer) here. However, a peeling method is not particularly limited. For example, in a method of providing a separate layer made of amorphous silicon (or polysilicon) and irradiating laser light thereto through a substrate to release hydrogen contained in the amorphous silicon film, thereby producing gaps to separate the substrate from a layer to be peeled, when preprocessing for selectively (partially) reducing the contact property is performed on only the vicinity of the outer edge of the substrate before peeling, peeling can be conducted without insufficient peeling.

Next, when TiN, W, WN, Ta, or TaN is used as a material of the first material layer, the second material layer (silicon oxide: 200 nm in film thickness) is provided in contact with the first material layer. Then, the following test is conducted for checking whether or not the layer to be peeled which is provided on the second material layer can be peeled from the substrate.

In order to obtain Sample 1, a TiN film having a film thickness of 100 nm is formed on a glass substrate by a sputtering method and then a silicon oxide film having a film thickness of 200 nm is formed by the sputtering method. After the formation of the silicon oxide film, lamination and crystallization are performed as in the above test.

In order to obtain Sample 2, a W film having a film thickness of 50 nm is formed on a glass substrate by the sputtering method and then a silicon oxide film having a film thickness of 200 nm is formed by the sputtering method. After the formation of the silicon oxide film, lamination and crystallization are performed as in the above test.

In order to obtain Sample 3, a WN film having a film thickness of 50 nm is formed on a glass substrate by the sputtering method and then a silicon oxide film having a film thickness of 200 nm is formed by the sputtering method. After the formation of the silicon oxide film, lamination and crystallization are performed as in the above test.

In order to obtain Sample 4, a TiN film having a film thickness of 50 nm is formed on a glass substrate by the sputtering method and then a silicon oxide film having a film thickness of 200 nm is formed by the sputtering method. After the formation of the silicon oxide film, lamination and crystallization are performed as in the above test.

In order to obtain Sample 5, a Ta film having a film thickness of 50 nm is formed on a glass substrate by the sputtering method and then a silicon oxide film having a film thickness of 200 nm is formed by the sputtering method.

After the formation of the silicon oxide film, lamination and crystallization are performed as in the above test.

In order to obtain Sample 6, a TaN film having a film thickness of 50 nm is formed on a glass substrate by the sputtering method and then a silicon oxide film having a film thickness of 200 nm is formed by the sputtering method. After the formation of the silicon oxide film, lamination and crystallization are performed as in the above test.

Thus, Samples 1 to 6 are obtained. With respect to each sample, a portion thereof is scratched by the diamond pen, then the bonding tape is bonded to the layer to be peeled, and the test for checking whether or not it is peeled is conducted. The result is indicated in Table 1.

TABLE 1

|  | First material layer (Lower layer) | Second material layer (Upper layer) | Tape test |
| --- | --- | --- | --- |
| Sample 1 | TiN (100 nm) | Silicon oxide (200 nm) | peeled |
| Sample 2 | W (50 nm) | Silicon oxide (200 nm) | peeled |
| Sample 3 | WN (50 nm) | Silicon oxide (200 nm) | peeled |
| Sample 4 | TiN (50 nm) | Silicon oxide (200 nm) | not peeled |
| Sample 5 | Ta (50 nm) | Silicon oxide (200 nm) | not peeled |
| Sample 6 | TaN (50 nm) | Silicon oxide (200 nm) | not peeled |

Also, with respect to the silicon oxide film, the TiN film, the W film, and the Ta film, each internal stress is measured before and after heat treatment (at 550° C. for 4 hours). The result is indicated in table 2.

TABLE 2

| | Internal stress value of film ($dyne/cm^2$) | |
| --- | --- | --- |
| | After film formation | After heat treatment |
| Silicon oxide film | −9.40E+08 | −1.34E+09 |
| | −9.47E+08 | −1.26E+09 |
| TiN film | 3.90E+09 | 4.36E+09 |
| | 3.95E+09 | 4.50E+09 |
| W film | −7.53E+09 | 8.96E+09 |
| | −7.40E+09 | 7.95E+09 |
| Ta film | 9.23E+09 | −7.84E+09 |
| | 5.16E+09 | −1.95E+10 |

Note that the measurement is conducted for the silicon oxide film formed at a film thickness of 400 nm on a silicon substrate by the sputtering method. In addition, the TiN film, the W film, and the Ta film each are formed at a film thickness of 400 nm on a glass substrate by the sputtering method and then each internal stress is measured. After that, the silicon oxide film is laminated as a cap film and heat treatment is performed, and then the cap film is removed by etching and each internal stress is measured again. In addition, two samples are produced for the respective films and the measurement is performed.

The W film has compression stress (about $-7 \times 10^9$ dyne/$cm^2$) immediately after the formation. However, it becomes a film having tensile stress (about $8 \times 10^9$ dyne/$cm^2$ to $9 \times 10^9$ dyne/$cm^2$) by heat treatment. Thus, a preferable peeling state is obtained. With respect to the TiN film, the stress is almost the same before and after heat treatment and it has tensile stress (about $3.9 \times 10^9$ dyne/$cm^2$ to $4.5 \times 10^9$ dyne/$cm^2$). When the film thickness is 50 nm or less, poor peeling is caused. In addition, with respect to the Ta film, it has tensile stress (about $5.1 \times \times 10^9$ dyne/$cm^2$ to $9.2 \times 10^9$ dyne/$cm^2$) immediately after the formation. However, the film becomes a film having compression stress (about $-2 \times 10^9$ dyne/$cm^2$ to $-7.8 \times 10^9$ dyne/$cm^2$) by heat treatment. Thus, peeling is not produced in the tape test. In addition, with respect to the silicon film, the stress is almost the same before and after heat treatment and it has compression stress (about $-9.4 \times 10^8$ dyne/cm$^2$ to $-1.3 \times 10^9$ dyne/cm$^2$).

From these results, a peeling phenomenon is related to the contact property due to various factors. Particularly, it is greatly related to the internal stress. When the second material layer having compression stress is used and a film having tensile stress which is obtained by heat treatment is used as the first material layer, it can be read that the layer to be peeled can be peeled over the entire surface from the substrate. In addition, in the case where tensile stress is changed by heat treatment or laser light irradiation, it is desirable that a material in which a tensile stress value is increased as compared with that before heat treatment or laser light irradiation is used for the first material layer.

Also, particularly when the first material layer or the second material layer is thin, processing for partially reducing the contact property before peeling in the present invention is effective. This is because if the film thickness is small, a thickness distribution in a substrate at film formation is easy to vary and internal stress of a film, a film quality, and the like are easy to change, thereby being hard to peel. In order to improve a throughput, it is preferable that the film thickness of the first material layer or that of the second material layer is minimized.

The present invention made by the above constitution will be described in more detail through the following embodiments.

Embodiment 1

An embodiment of the present invention is described with reference to FIGS. 5A to 7. Here, a method of simultaneously manufacturing a pixel portion and TFTs (n-channel TFTs and a p-channel TFT) of a driver circuit provided in the periphery of the pixel portion on the same substrate is described in detail.

First, the first material layer 101, the second material layer 102, a base insulating film 103 are formed on a substrate 100 and a semiconductor film having a crystalline structure is obtained. Then, the semiconductor film is etched to have a desired shape to form semiconductor layers 104 to 108 separated from one another in an island shape.

A glass substrate (#1737) is used as the substrate 100.

If materials using for the first material layer 101 having a tensile stress within a range of 1 to $1 \times 10^{10}$ (dyne/cm$^2$) directly before the peeling process done later, the material is not particularly limited to specific materials. A layer or lamination layer from the following material can be used for the first material layer 101; a metallic material (Ti, Al, Ta, W, Mo, Cu, Cr, Nd, Fe, Ni, Co, Zr, Zn, Ru, Rh, Pd, Os, Ir, and Pt, etc.), semiconductor materials (for instance, Si and Ge, etc.), insulating materials or organic materials. Here, titanium nitride film having film thickness of 100 nm laminated by a sputtering method is used.

If materials used for the second material layer 102 having a compressive stress within a range of $-1$ to $-1 \times 10^{10}$ (dyne/cm$^2$) directly before the peeling process done later, the material is not particularly limited to specific materials. A layer or lamination layer from the following can be used for the second material layer 102; a metallic material (Ti, Al, Ta, W, Mo, Cu, Cr, Nd, Fe, Ni, Co, Zr, Zn, Ru, Rh, Pd, Os, Ir, and Pt, etc.), semiconductor materials (for instance, Si and Ge, etc.), insulating materials or organic materials. Here, a single layer or a lamination layer composed of oxide silicon material or oxide metal material can be used. A silicon oxide film having film thickness of 200 nm laminated by a sputtering method is used. The bonding force between the first material layer 101 and the second material layer 102 is strong against heat treatment, so that the film peeling (also referred to as peeling) or the like does not occur. However, it can be easily peeled off on the inside of the second material layer or on the interface by the physical means.

For the base insulating film 103, a silicon oxynitride film 103a formed from SiH$_4$, NH$_3$, and N$_2$O as material gases (composition ratio: Si=32%, O=27%, N=24%, H=17%) is formed with a thickness of 50 nm (preferably 10 to 200 nm) and at a film deposition temperature of 400° C. by using plasma CVD. Then, after the surface is cleaned with ozone water, an oxide film on the surface is removed by means of dilute hydrofluoric acid (dilution with 1/100). Next, a silicon oxynitride film 103b formed from SiH$_4$ and N$_2$O as material gases (composition ratio: Si=32%, O=59%, N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 25 to 80 nm) with SiH$_4$ as a film deposition gas and at a film deposition temperature of 300° C. by using plasma CVD.

In this embodiment, the base film 103 is shown in a form of a two-layer structure, but a single layer of the above-mentioned insulating film or a structure in which two or more layers thereof are laminated may be adopted. Further, there is no limitation on the material of the semiconductor film. However, the semiconductor film may be preferably formed of silicon or silicon germanium (Si$_X$Ge$_{1-X}$ (X=0.0001 to 0.02)) alloy by using a known means (sputtering, LPCVD, plasma CVD or the like). Further, a plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface. Then, in order to control a threshold value of a TFT, doping of a minute amount of impurity element (boron or phosphorous) is performed. Here, an ion doping method is used in which diborane (B$_2$H$_6$) is plasma-excited without mass-separation, and boron is added to the amorphous silicon film under the doping conditions: an acceleration voltage of 15 kV; a gas flow rate of diborane diluted to 1% with hydrogen of 30 sccm; and a dosage of $2 \times 10^{12}$/cm$^2$.

Then, a nickel acetate salt solution containing nickel of 10 ppm in weight is applied using a spinner. Instead of the application, a method of spraying nickel elements to the entire surface by sputtering may also be used.

Then, heat treatment is conducted to perform crystallization, thereby forming a semiconductor film having a crystalline structure. A heat treatment using an electric furnace or irradiation of strong light may be conducted for this heat treatment. In case of the heat treatment using an electric furnace, it may be conducted at 500 to 650° C. for 4 to 24 hours. Here, after the heat treatment (500° C. for 1 hour) for dehydrogenation is conducted, the heat treatment (550° C. for 4 hours) for crystallization is conducted, thereby obtaining a silicon film having a crystalline structure. Note that, although crystallization is performed by using the heat treatment using a furnace, crystallization may be performed by means of a lamp annealing apparatus. Also note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline structure is removed by dilute hydrofluoric acid or the like, irradiation of first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In this case, pulse laser light with a repetition frequency of approximately 10 to 1000 Hz is used, the pulse laser light is condensed to 100 to 500 mJ/cm$^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 393 mJ/cm$^2$. Note that an oxide film is formed on the surface by the first laser light irradiation since the irradiation is conducted in an atmosphere or in an oxygen atmosphere. Also note that, although, an example of using a pulse laser is shown here, a continuous oscillation laser may also be used. When an amorphous semiconductor film is crystallized, it is preferable to use a solid laser which can oscillate continuously and to apply the second harmonic wave to the fourth harmonic wave in order to obtain a large particle size crystal. Typically, it only has to apply the second harmonic wave (532 nm) and the third harmonic wave (355 nm) of the Nd:YVO$_4$ laser (basic wave 1064 nm). When a continuous oscillation laser is used, the laser light injected from a continuous oscillation YVO$_4$ laser of output 10 W is converted into a harmonic wave with a nonlinear optical element. Moreover, there is a method of injecting a harmonic wave by putting the YVO$_4$ crystal and a nonlinear optical element into the resonator. Preferably, the laser light is formed into a rectangular shape or an elliptic shape on the radiation surface, and the laser light is radiated to the processed substrate. The energy density at this time is necessary about 0.01 to 100 MW/cm$^2$ (Desirability is 0.1 to 10 MW/cm$^2$). The semiconductor film is moved relatively at 10 to 2000 cm/s with respect to the laser light, and the laser light can be radiated.

Next, after the oxide film formed by the first laser light irradiation is removed by dilute hydrofluoric acid, the second laser light irradiation is performed in a nitrogen atmosphere or in a vacuum, thereby the semiconductor film surface is leveled. Excimer laser light with a wavelength of 400 nm or less, or second harmonic wave or third harmonic wave of a YAG laser is used as the laser light (the second laser light). The energy density of the second laser light is made larger than that of the first laser light, preferably made larger by 30 to 60 mJ/cm$^2$. Here, the second laser light irradiation is performed with a repetition frequency of 30 Hz and energy density of 453 mJ/cm$^2$ to thereby set a P-V value (Peak to Valley, the difference between the maximum value and the minimum value in height) of unevenness in the semiconductor film surface to 50 nm or less. Here, the P-V value of unevenness may be obtained by AFM (atomic force microscope).

Further, although the second laser light irradiation is conducted over the surface in this embodiment, a step of selectively performing irradiation at least on a pixel portion may be adopted since the reduction of an off current particularly has an effect on a TFT of the pixel portion.

Next, the surface is processed with ozone water for 120 seconds, thereby forming a barrier layer comprised of an oxide film with a thickness of 1 to 5 nm in total.

Then, an amorphous silicon film containing an argon element, which becomes a gettering site, is formed on the barrier layer to have a thickness of 150 nm by sputtering. The film deposition conditions with sputtering in this embodiment are: a film deposition pressure of 0.3 Pa; a gas (Ar) flow rate of 50 sccm; a film deposition power of 3 kW; and a substrate temperature of 150° C. Note that under the above conditions, the atomic concentration of the argon element contained in the amorphous silicon film is $3 \times 10^{20}$/cm$^3$ to $6 \times 10^{20}$/cm$^3$, and the atomic concentration of oxygen is $1 \times 10^{19}$/cm$^3$ to $3 \times 10^{19}$/cm$^3$. Thereafter, heat treatment at 650° C. for 3 minutes is conducted using the lamp annealing apparatus to perform gettering.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers 104 to 108 separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 109, is formed. In this embodiment, a silicon oxynitride film (composition ratio: Si=32%, O=59%, N=7%, H=2%) is formed with a thickness of 115 nm by plasma CVD.

Next, as shown in FIG. 5A, on the gate insulating film 109, a first conductive film 110*a* with a thickness of 20 to 100 nm and a second conductive film 110*b* with a thickness of 100 to 400 nm are formed in lamination. In this embodiment, a 50 nm thick tantalum nitride film and a 370 nm thick tungsten film are sequentially laminated on the gate insulating film 109.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Next, as shown in FIG. 5B, masks 112 to 117 are formed by a light exposure step, and a first etching process for forming gate electrodes and wirings is performed. The first etching process is performed with first and second etching conditions. An ICP (Inductively Coupled Plasma) etching method may be preferably used for the etching process. The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. Note that chlorine-based gases typified by $Cl_2$, $BCl_3$, $SiCl_4$, $CCl_4$ or the like, fluorine-based gases typified by $CF_4$, $SF_6$, $NF_3$, or the like and $O_2$ can be appropriately used as etching gases.

In this embodiment, RF (13.56 MHZ) power of 150 W is applied also to the substrate (sample stage) to substantially apply a negative self-bias voltage. It should be noted that the size of the electrode area on the side of the substrate is 12.5 cm×12.5 cm and the size of the coil type electrode area (here, quartz disk on which the coil is provided) is a disk having a diameter of 25 cm. With the first etching conditions, a W film is etched to form an end portion of the first conductive layer into a tapered shape. Under the first etching conditions, an etching rate to W is 200.39 nm/min, an etching rate to TaN is 80.32 nm/min, and a selection ratio of W to TaN is about 2.5. Further, with the first etching conditions, a taper angle of W is approximately 26°. Thereafter, the first etching conditions are changed to the second etching conditions without removing the masks 112 to 117 made of resist. $CF_4$ and $Cl_2$ are used as etching gases, the flow rate of the gases is set to 30/30 sccm, and RF (13.56 MHZ) power of 500 W is applied to a coil-shape electrode with a pressure of 1 Pa to generate plasma, thereby performing etching for about 30 seconds. RF (13.56 MHZ) power of 20 W is also applied to the substrate side (sample stage) to substantially apply a negative self-bias voltage. Under the second etching conditions in which $CF_4$ and $Cl_2$ are mixed, both the W film and the TaN film are etched at the same level. With the second etching conditions, an etching rate to W is 58.97 nm/min, and an etching rate to TaN is 66.43 nm/min. Note that an etching time may be increased by 10 to 20% in order to conduct etching without remaining residue on the gate insulating film.

In the first etching process as described above, the shape of the mask made of resist is made appropriate, whereby the end portion of the first conductive layer and the end portion of the second conductive layer each have a tapered shape due to the effect of the bias voltage applied to the substrate side. The angle of the tapered portion is sufficiently set to 15 to 45°.

Thus, first shape conductive layers 119 to 123 composed of the first conductive layer and the second conductive layer (first conductive layers 119a to 123a and second conductive layers 119b to 123b) are formed by the first etching process. The insulating film 109 that becomes the gate insulating film is etched by approximately 10 to 20 nm, and becomes a gate insulating film 118 in which regions which are not covered by the first shape conductive layers 119 to 123 are thinned.

Next, a second etching process is conducted without removing the masks made of resist. Here, $SF_6$, $Cl_2$ and $O_2$ are used as etching gases, the flow rate of the gases is set to 24/12/24 (sccm), and RF (13.56 MHZ) power of 700 W is applied to a coil-shape electrode with a pressure of 1.3 Pa to generate plasma, thereby performing etching for 25 seconds. RF (13.56 MHZ) power of 10 W is also applied to the substrate side (sample stage) to substantially apply a negative self-bias voltage. In the second etching process, an etching rate to W is 227.3 nm/min, an etching rate to TaN is 32.1 nm/min, a selection ratio of W to TaN is 7.1, an etching rate to SiON that is the insulating film 118 is 33.7 nm/min, and a selection ratio of W to SiON is 6.83. In the case where $SF_6$ is used as the etching gas, the selection ratio with respect to the insulating film 118 is high as described above. Thus, reduction in the film thickness can be suppressed. In this embodiment, the film thickness of the insulating film 118 is reduced by only about 8 nm.

By the second etching process, the taper angle of W becomes 70°. By the second etching process, second conductive layers 126b to 131b are formed. On the other hand, the first conductive layers are hardly etched to become first conductive layers 126a to 131a. Note that the first conductive layers 126a to 131a have substantially the same size as the first conductive layers 119a to 124a. In actuality, the width of the first conductive layer may be reduced by approximately 0.3 μm, namely, approximately 0.6 μm in the total line width in comparison with before the second etching process. However, there is almost no change in size of the first conductive layer.

Further, in the case where, instead of the two-layer structure, the three-layer structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as material gases; the flow rate of the gases is set to 65/10/5 (sccm); RF (1356 MHZ) power of 300 W is applied to the substrate side (sample stage); and RF (13.56 MHZ) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rate of the gases is set to 25/25/10 sccm, RF (13.56 MHZ) power of 20 W is also applied to the substrate side (sample stage); and RF (13.56 MHZ) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56 MHZ) power of 100 W is applied to the substrate side (sample stage), and RF (13.56 MHZ) power of 600 W is applied to a coil-shape electrode with a pressure of 1.2 Pa to generate plasma, thereby performing etching.

Next, the masks made of resist are removed, and then, a first doping process is conducted to obtain the state of FIG. 5D. The doping process may be conducted by ion doping or ion implantation. Ion doping is conducted with the conditions of a dosage of $1.5 \times 10^{14}$ atoms/cm$^2$ and an accelerating voltage of 60 to 100 keV. As an impurity element imparting n-type conductivity, phosphorous (P) or arsenic (As) is typically used. In this case, first conductive layers and second conductive layers 126 to 130 become masks against the impurity element imparting n-type conductivity, and first impurity regions 132 to 136 are formed in a self-aligning manner. The impurity element imparting n-type conductivity is added to the first impurity regions 132 to 136 in a concentration range of $1 \times 10^{16}$ to $1 \times 10^{17}$/cm$^3$. Here, the region having the same concentration range as the first impurity region is also called an n$^-$ region.

Note that although the first doping process is performed after the removal of the masks made of resist in this embodiment, the first doping process may be performed without removing the masks made of resist.

Subsequently, as shown in FIG. 6A, masks 137 to 139 made of resist are formed, and a second doping process is conducted. The mask 137 is a mask for protecting a channel forming region and a periphery thereof of a semiconductor layer forming a p-channel TFT of a driver circuit, the mask 138 is a mask for protecting a channel forming region and a periphery thereof of a semiconductor layer forming one of n-channel TFTs of the driver circuit, and the mask 139 is a mask for protecting a channel forming region, a periphery thereof, and a storage capacitor of a semiconductor layer forming a TFT of a pixel portion.

With the ion doping conditions in the second doping process: a dosage of $1.5 \times 10^{15}$ atoms/cm$^2$; and an accelerating voltage of 60 to 100 keV, phosphorous (P) is doped. Here, impurity regions are formed in the respective semiconductor layers in a self-aligning manner with the second conductive layers 126b to 128b as masks. Of course, phosphorous is not added to the regions covered by the masks 137 to 139. Thus, second impurity regions 140 to 142 and a third impurity region 144 are formed. The impurity element imparting n-type conductivity is added to the second impurity regions 140 to 142 in a concentration range of $1 \times 10^{20}$ to $1 \times 10^{21}$/cm$^3$. Here, the region having the same concentration range as the second impurity region is also called an n$^+$ region.

Further, the third impurity region is formed at a lower concentration than that in the second impurity region by the first conductive layer, and is added with the impurity element imparting n-type conductivity in a concentration range of $1 \times 10^{18}$ to $1 \times 10^{19}$/cm$^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is also called a n$^-$ region. Furthermore, the regions covered by the masks 138 and 139 are not added with the impurity element in the second doping process, and become first impurity regions 145, 146 and 147.

Next, after the masks 137 to 139 made of resist are removed, masks 148 to 150 made of resist are newly formed, and a third doping process is conducted as shown in FIG. 6B.

In the driver circuit, by the third doping process as described above, fourth impurity regions 151, 152 and fifth impurity regions 153, 154 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 151 and 152 in a concentration range of $1 \times 10^{20}$ to $1 \times 10^{21}$/cm$^3$. Note that, in the fourth impurity regions 151, 152, phosphorous (P) has been added in the preceding step (n$^-$ region), but the impurity element imparting p-type conductivity is added at a concentration that is 1.5 to 3 times as high as that of phosphorous. Thus, the fourth impurity regions 151, 152 have a p-type conductivity. Here, the region having the same concentration range as the fourth impurity region is also called a p$^+$ region.

Further, fifth impurity regions 153 and 154 are formed in regions overlapping the tapered portion of the second conductive layer 127a, and are added with the impurity element imparting p-type conductivity in a concentration range of $1 \times 10^{18}$ to $1 \times 10^{20}$/cm$^3$. Here, the region having the same concentration range as the fifth impurity region is also called a p$^-$ region.

Through the above-described steps, the impurity regions having n-type or p-type conductivity are formed in the respective semiconductor layers. The conductive layers 126 to 129 become gate electrodes of a TFT. Further, the conductive layer 130 becomes one of electrodes, which forms the storage capacitor in the pixel portion. Moreover, the conductive layer 131 forms a source wiring in the pixel portion.

Next, an insulating film (not shown) that covers substantially the entire surface is formed. In this embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this embodiment, a step of forming the insulating film may be conducted after the activation is conducted.

Next, a first interlayer insulating film 155 is formed of a silicon nitride film, and heat treatment (300 to 550° C. for 1 to 12 hours) is performed, thereby conducting a step of hydrogenating the semiconductor layers. (FIG. 6C) This step is a step of terminating dangling bonds of the semiconductor layers by hydrogen contained in the first interlayer insulating film 155. The semiconductor layers can be hydrogenated irrespective of the existence of an insulating film (not shown) formed of a silicon oxide film. Incidentally, in this embodiment, a material containing aluminum as its main constituent is used for the second conductive layer, and thus, it is important to apply the heat treatment condition that the second conductive layer can withstand in the step of hydrogenation. As another means for hydrogenation, plasma hydrogenation (using hydrogen excited by plasma) may be conducted.

Next, a second interlayer insulating film 156 is formed from an organic insulating material on the first interlayer insulating film 155. In this embodiment, an acrylic resin film with a thickness of 1.6 μm is formed. Then, a contact hole that reaches the source wiring 131, contact holes that respectively reach the conductive layers 129 and 130, and contact holes that reach the respective impurity regions are formed. In this embodiment, plurality of etching processes are sequentially performed. In this embodiment, the second interlayer insulting film is etched with the first interlayer insulating film as the etching stopper, the first interlayer insulating film is etched with the insulating film (not shown) as the etching stopper, and then, the insulating film (not shown) is etched.

Thereafter, wirings and pixel electrode are formed by using Al, Ti, Mo, W and the like. As the material of the electrodes and pixel electrode, it is desirable to use a material excellent in reflecting property, such as a film containing Al or Ag as its main constituent or a lamination film of the above film. Thus, source electrodes or drain electrodes 157 to 162, a gate wiring 164, a connection wiring 163, and a pixel electrode 165 are formed.

As described above, a driver circuit 206 having an n-channel TFT 201, a p-channel TFT 202, and an n-channel TFT 203 and a pixel portion 207 having a pixel TFT 204 comprised of an n-channel TFT and a storage capacitor 205 can be formed on the same substrate. (FIG. 7) In this specification, the above substrate is called an active matrix substrate for the sake of convenience.

In the pixel portion 207, the pixel 204 (n-channel TFT) has a channel forming region 169, the first impurity region (n⁻ region) 147 formed outside the conductive layer 129 forming the gate electrode, and the second impurity region (n⁺ region) 142 and 171 functioning as a source region or a drain region. Further, in the semiconductor layer functioning as one of the electrodes of the storage capacitor 205, the fourth impurity region 152 and the fifth impurity region 154 are formed. The storage capacitor 205 is constituted of the second electrode 130 and the semiconductor layers 152, 154, and 170 with the insulating film (the same film as the gate insulating film) 118 as dielectric.

Further, in the driver circuit 206, the n-channel TFT 201 (first n-channel TFT) has a channel forming region 166, the third impurity region (n⁻ region) 144 that overlaps a part of the conductive layer 126 forming the gate electrode through the insulating film, and the second impurity region (n⁺ region) 140 functioning as a source region or a drain region.

Further, in the driver circuit 206, the p-channel TFT 202 has a channel forming region 167, the fifth impurity region (p⁻ region) 153 that overlaps a part of the conductive layer 127 forming the gate electrode through the insulating film, and the fourth impurity region (p⁺ region) 151 functioning as a source region or a drain region.

Furthermore, in the driver circuit 206, the n-channel TFT 203 (second n-channel TFT) has a channel forming region 168, the first impurity region (n⁻ region) 146 outside the conductive layer 128 forming the gate electrode, and the second impurity region (n⁺ region) 141 functioning as a source region or a drain region.

The above TFTs 201 to 203 are appropriately combined to form a shift register circuit, a buffer circuit, a level shifter circuit, a latch circuit and the like, thereby forming the driver circuit 206. For example, in the case where a CMOS circuit is formed, the n-channel TFT 201 and the p-channel TFT 202 may be complementarily connected to each other.

In particular, the structure of the n-channel TFT 203 is appropriate for the buffer circuit having a high driving voltage with the purpose of preventing deterioration due to a hot carrier effect.

Moreover, the structure of the n-channel TFT 201, which is a GOLD structure, is appropriate for the circuit in which the reliability takes top priority.

From the above, the reliability can be improved by improving the flatness of the semiconductor film surface. Thus, in the TFT having the GOLD structure, sufficient reliability can be obtained even if the area of the impurity region that overlaps the gate electrode through the gate insulating film is reduced. Specifically, in the TFT having the GOLD structure, sufficient reliability can be obtained even if the size of the portion that becomes the tapered portion of the gate electrode is reduced.

In the TFT with the GOLD structure, a parasitic capacitance increases when the gate insulating film is thinned. However, the size of the tapered portion of the gate electrode (first conductive layer) is reduced to reduce the parasitic capacitance, whereby the TFT becomes to enable high-speed operation with improved f-characteristic (frequency characteristic) and to have sufficient reliability.

Note that, in the pixel TFT of the pixel portion 207 as well, the second laser light irradiation enables the reduction in off current and the reduction in fluctuation.

Further, an example of manufacturing the active matrix substrate for forming a reflection type display device is shown in this embodiment. However, if the pixel electrode is formed of a transparent conductive film, a transmission type display device can be formed although the number of photomasks is increased by one.

Moreover, in this embodiment, a glass substrate was used, but it is not particularly limited. A quartz substrate, a semiconductor substrate, a ceramic substrate, and a metal substrate can be used.

Figure 7:
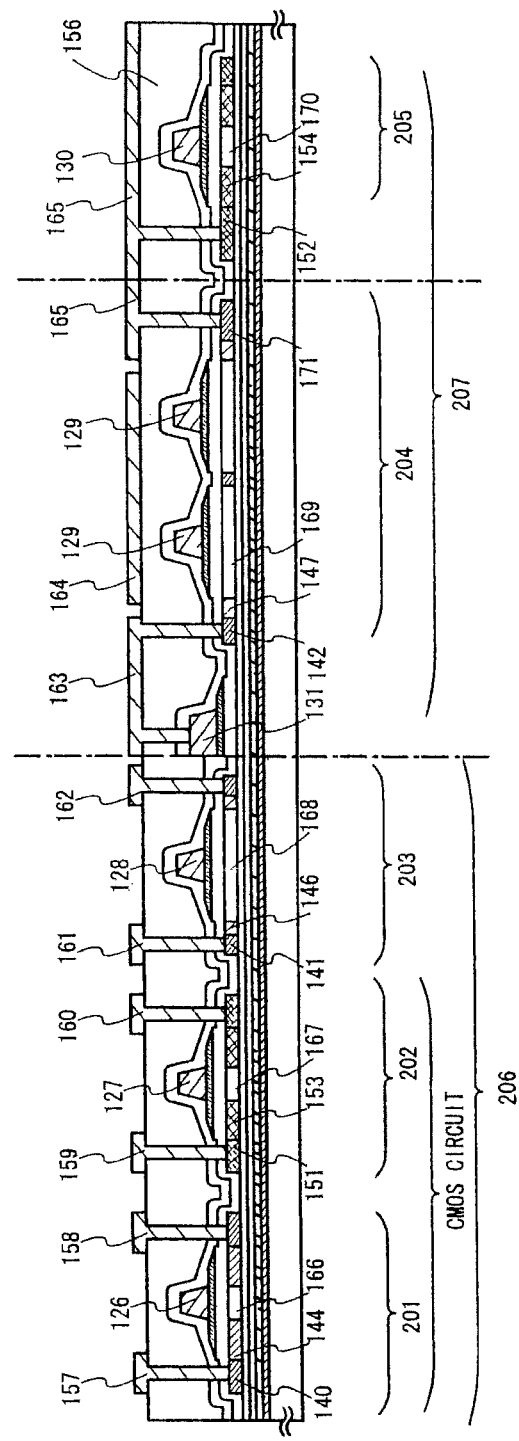
FIG. 7 is a sectional view showing the active matrix substrate.

Moreover, after the state of FIG. 7 is obtained, if the layer (peeled-off layer) containing a TFT provided on the second material layer 102 has a sufficient mechanical strength, the substrate 100 may be peeled off. The substrate 100 can be peeled off by comparatively small power (for instance, a man's hand, a wind pressure insufflated from a nozzle, a supersonic and the like) because the second material layer 102 has the compressive stress, and the first material layer 101 has the tensile stress. In this embodiment, since the mechanical strength of the peeled-off layer is not sufficient, it is preferred that the peeled-off layer is peeled off after the supporting body (not shown) for fixing the peeled-off layer.

Embodiment 2

In this embodiment, steps of peeling the substrate 100 from the active matrix substrate produced in Embodiment 1 and then bonding it to a plastic substrate to manufacture an active matrix liquid crystal display device will be described below. FIGS. 8A to 8D are used for the description.

Figure 8A:
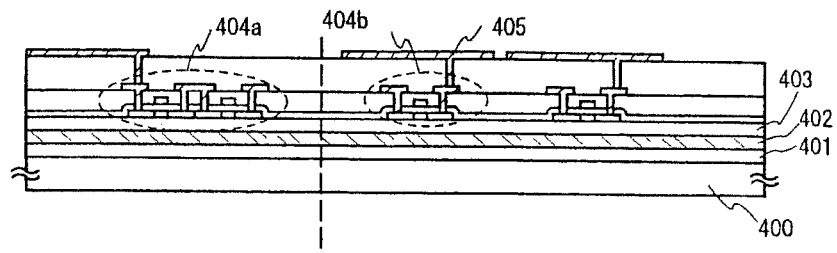
FIGS. 8A to 8D are explanatory views of Embodiment 2.

In FIG. 8A, reference numeral 400 denotes a substrate, 401 denotes a first material layer, 402 denotes a second material layer, 403 denotes a base insulating layer, 404a denotes an element of a driver circuit 413, 404b denotes an element of a pixel portion 414, and 405 denotes a pixel electrode. Here, the element indicates a semiconductor element (typically, a TFT), an MIM element, or the like which is used as an switching element of a pixel in the active matrix liquid crystal display device. An active matrix substrate of FIG. 8A is shown by simplifying the active matrix substrate of FIG. 7. The substrate 100 in FIG. 7 corresponds to the substrate 400 in FIG. 8A. In the same manner, reference numeral 401 in FIG. 8A corresponds to 101 in FIG. 7, 402 corresponds to 102, 403 corresponds to 103, 404a corresponds to 201 and 202, 404b corresponds to 204, and 405 corresponds to 165.

First, after the active matrix substrate shown in FIG. 7 is obtained in accordance with Embodiment 1, an alignment film 406a is formed on the active matrix substrate and rubbing processing is performed. Note that, in this embodiment, an organic resin film such as an acrylic resin film is patterned form column-shaped spacers (not shown) for keeping a substrate interval constant at predetermined positions before the formation of the alignment film Instead of the column-shaped spacers, spherical spacers may be sprayed on the entire surface of the substrate.

Next, a counter substrate is prepared as a support 407. A color filter (not shown) in which a colored layer and a light shielding layer are located corresponding to each pixel is provided to the counter substrate. A glass substrate may be used as the counter electrode. Here, a plastic substrate is used for weight reduction. In addition, a light shielding layer is provided to a region of the driver circuit. A planarizing film (not shown) which covers the color filter and the light shielding layers is provided. Then, a counter electrode 408 made from a transparent conductive film is formed on the plan arizing film in the pixel portion. An alignment film 406*b* is formed on the entire surface of the counter substrate and rubbing processing is performed.

Figure 8B:
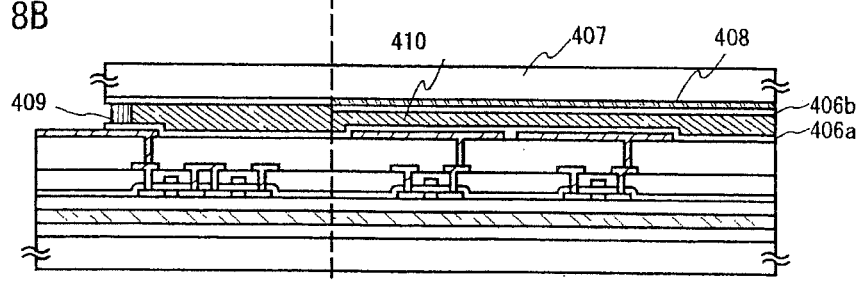

Then, the active matrix substrate 400 on which the pixel portion and the driver circuit are formed and the support 407 are bonded to each other through a sealing member serving as a bonding layer 409. A filler is mixed into the sealing member. Thus, the two substrates are bonded to each other with the filler and the column-shaped spacers at a predetermined interval. After that, a liquid crystal material 410 is injected between both substrates and complete sealing is conducted by a sealing agent (not shown) (FIG. 8B). A known liquid crystal material may be used as the liquid crystal material 410.

Figure 9A:
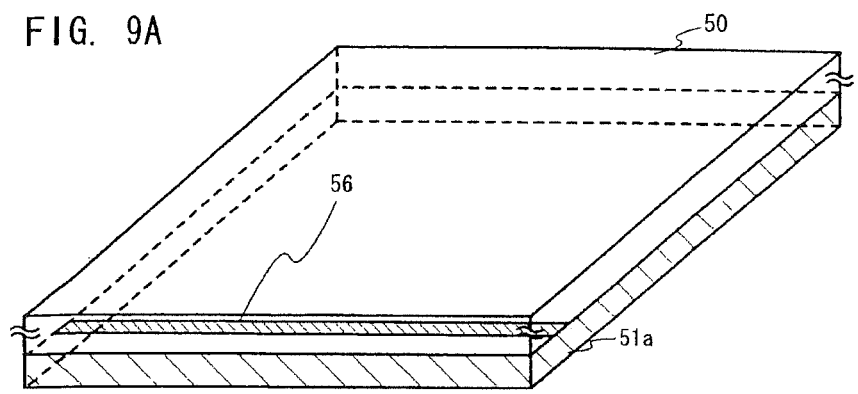
FIGS. 9A to 9C are explanatory views of Embodiment 2.
Figure 9B:
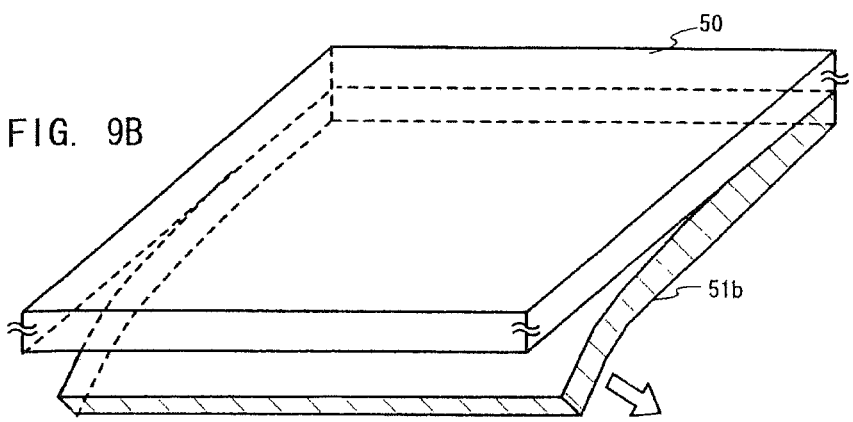
Figure 9C:
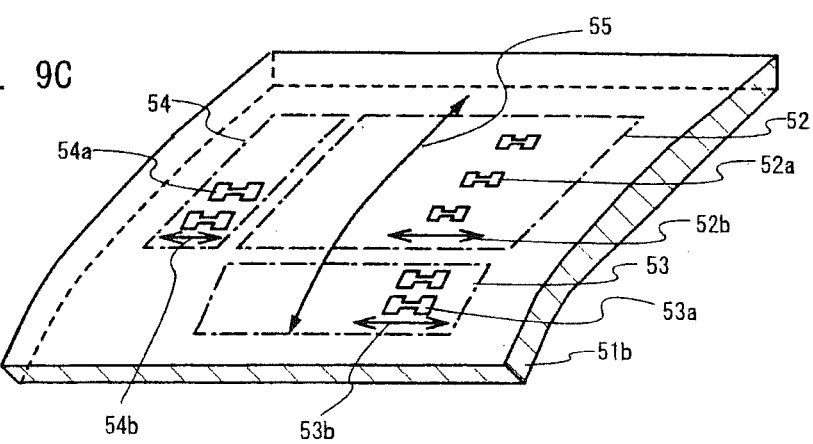

Next, any one of processings shown in Embodiment Modes 1 to 3 (processing for partially reducing the contact property) is performed. Here, an example of laser light irradiation will be described using FIGS. 9A to 9C. FIG. 9A is a schematic perspective view of the active matrix substrate and shows a substrate 50 to which a layer to be peeled 51*a* is provided. The substrate 400 shown in FIG. 8A corresponds to the substrate 50 shown in FIG. 9A and both substrates are the same. Here, the layer to be peeled 51*a* includes the TFTs, the liquid crystal, and the counter electrode. In order to partially reduce the contact property, laser light is irradiated from the front surface side or the rear surface side along one end surface of the substrate to provide a laser light irradiation region 56. Then, the substrate 50 is peeled from the laser light irradiation region 56 side by physical means. FIG. 9B is a perspective view showing the progress of peeling. The plastic substrate is used as the counter electrode. Thus, a state that the layer to be peeled 51*b* is bended is shown in FIG. 9B. However, there is a possibility that a crack is caused in the layer to be peeled 51*b*. Accordingly, it is desirable that the layer to be peeled is not bended if possible. Thus, as shown in FIG. 9C, it is desirable that all channel length directions of thin film transistors are identical with each other so that an angle formed by a channel length direction of each of semiconductor layers 52*a*, 53*a*, and 54*a* serving as active layers of TFTs and a bending direction (peeling direction) 55 becomes 90°. In other words, it is desirable that a channel width direction of each of the TFTs is aligned with the bending direction (peeling direction) 55. Thus, even if the layer to be peeled having the element is bended, the influence on element characteristics can be minimized. Note that FIG. 9C shows the progress of peeling as in FIG. 9B. In addition, for simplification, the substrate is not shown and only semiconductor layers of TFTs in a pixel portion 52, a driver circuit (X-direction) 53, and a driver circuit (Y-direction) 54 which are provided to the layer to be peeled 51*b* are shown. In FIG. 9C, reference numerals 52*b*, 53*b*, and 54*b* denote channel length directions.

Figure 8C:
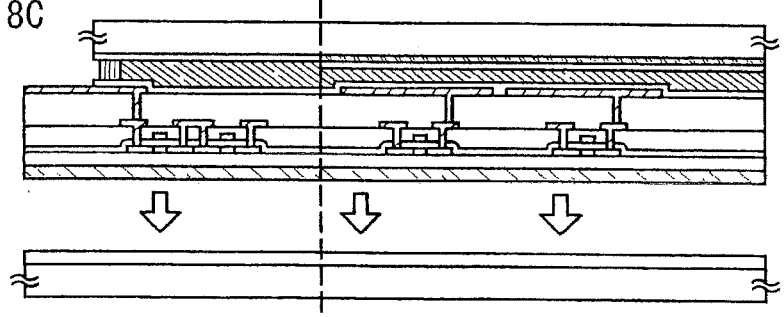
Figure 8D:
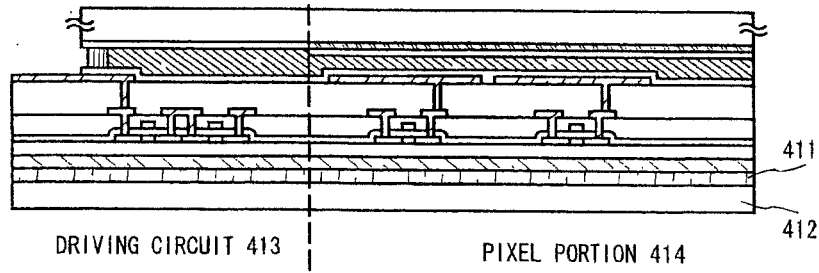

FIG. 8C shows a state which is obtained after peeling. The second material layer 402 has compression stress and the first material layer 401 has tensile stress. Thus, the layer to be peeled can be peeled by relatively small force (for example, by the hand of a person, by a blowing pressure of a gas blown from a nozzle, by ultrasound, or the like).

Next, the peeled layer is bonded to a transfer body 412 through a bonding layer 411 made of an epoxy resin or the like. In this embodiment, a plastic film substrate is used as the transfer body 412 for weight reduction.

Thus, a flexible active matrix liquid crystal display device is completed. If necessary, the flexible substrate 412 or the counter substrate is divided in predetermined shapes. Further, a polarizing plate (not shown) and the like are provided as appropriate by a known technique. Then, an FPC (not shown) is bonded by a known technique.

Embodiment 3

Figure 10:
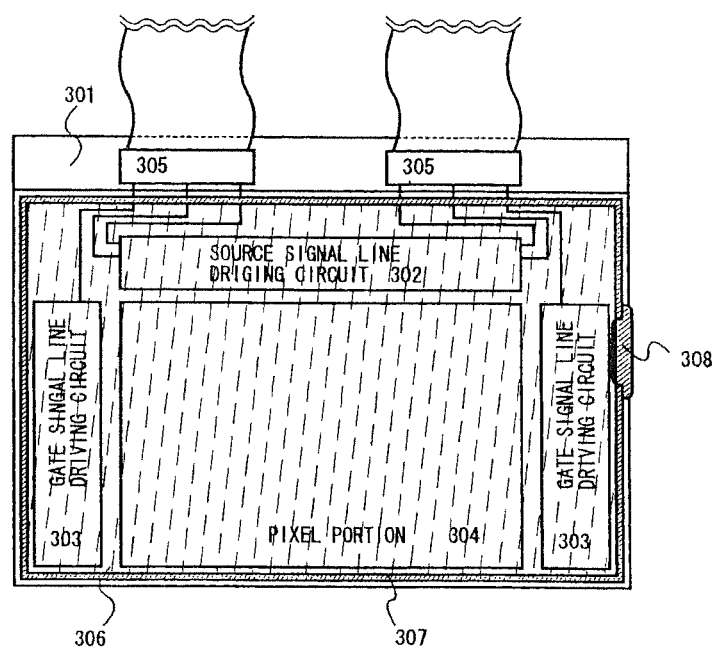
FIG. 10 shows a liquid crystal module.

The structure of the liquid crystal module obtained by Embodiment 2 is described with reference to the top view in FIG. 10. A substrate 412 in Embodiment 2 corresponds to a substrate 301.

A pixel portion 304 is placed in the center of a substrate 301. A source signal line driving circuit 302 for driving source signal lines is positioned above the pixel portion 304. Gate signal line driving circuits 303 for driving gate signal lines are placed to the left and right of the pixel portion 304. Although the gate signal line driving circuits 303 are symmetrical with respect to the pixel portion in this embodiment, the liquid crystal module may have only one gate signal line driving circuit on one side of the pixel portion. A designer can choose the arrangement that suits better in consideration of the substrate size or the like of the liquid crystal module. However, the symmetrical arrangement of the gate signal line driving circuits shown in FIG. 10 is preferred in terms of circuit operation reliability, driving efficiency, and the like.

Signals are inputted to the driving circuits from flexible printed circuits (FPC) 305. The FPCs 305 are press-fit through an anisotropic conductive film or the like after opening contact holes in the interlayer insulating film and a resin film and forming a connection electrode so as to reach the wiring lines arranged in given places of the substrate 301. The connection electrode is formed from ITO in this embodiment.

A sealing agent 307 is applied to the substrate along its perimeter surrounding the driving circuits and the pixel portion and then an opposite substrate 306 is bonded by the sealing agent 307 while a spacer formed in advance on the film substrate keeps the distance between the substrate 301 and the opposite substrate 306. A liquid crystal element is injected through an area of the substrate that is not coated with the sealing agent 307. The substrates are then sealed by an encapsulant 308. The device, containing all of these, shown FIG. 10 is called the liquid crystal module.

Although all of the driving circuits are formed on the film substrate in this embodiment shown here, several ICs may be used for some of the driving circuits.

This embodiment can be freely combined with Embodiment 1.

Embodiment 4

In this embodiment, an example of manufacturing a light emitting display device including an EL (electro luminescence) element formed on a plastic substrate is shown in FIGS. 11A to 11D.

Figure 11A:
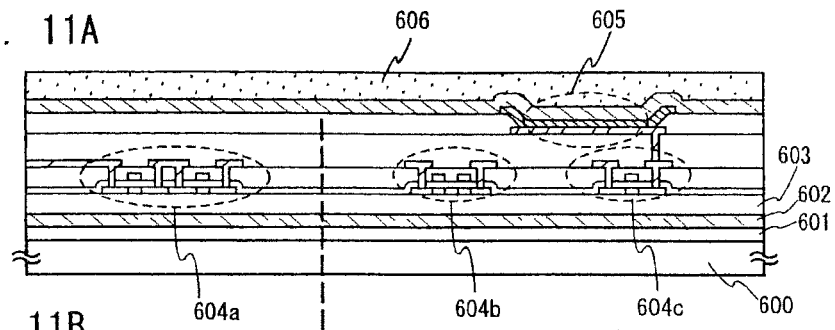
FIGS. 11A to 11D are explanatory views of Embodiment 4.

In FIG. 11A, reference numeral 600 denotes a substrate, 601 denotes a first material layer, 602 denotes a second material layer, 603 denotes a base insulating layer, 604*a* denotes an element of a driver circuit 611, 604*b* and 604*c* denote elements of a pixel portion 612, and 605 denotes an OLED (organic light emitting device). Here, the element indicates a semiconductor element (typically, a TFT), an MIM element, an OLED, or the like which is used as an switching element of a pixel in the case of an active matrix light emitting device. An interlayer insulating film 606 is formed to cover these elements. It is desirable that the surface of the interlayer insulating film 606 obtained after the formation is flatter. Note that the interlayer insulating film 606 is not necessarily provided.

Note that the layers 601 to 603 provided on the substrate 600 are preferably formed in accordance with Embodiment 1.

These elements (including 604a, 604b, and 604c) are preferably manufactured in accordance with the n-channel 201 and the p-channel TFT 202 in the above Embodiment 1.

The OLED 605 has a layer including an organic compound (organic light emitting material) in which luminescence (electroluminescence) is produced by applying an electric field thereto (hereinafter referred to as an organic light emitting layer), an anode layer, and a cathode layer. As the luminescence in the organic compound, there are light emission (fluorescence) produced when it is returned from a singlet excitation state to a ground state and light emission (phosphorescence) produced when it is returned from a triplet excitation state to a ground state. A light emitting device of the present invention may use any one of the above light emissions or both light emissions. Note that all layers formed between the anode and the cathode of the OLED is defined as an organic light emitting layer in this specification. The organic light emitting layer includes, specifically, a light emitting layer, a hole injection layer, an electron injection layer, a hole transport layer, and an electron transport layer. Fundamentally, the OLED has a structure in which the anode, the light emitting layer, and the cathode are laminated in order. In addition to such a structure, there is the case where the OLED has a structure in which the anode, the hole injection layer, the light emitting layer, and the cathode are laminated in order or a structure in which the anode, the hole injection layer, the light emitting layer, the electron transport layer, and the cathode are laminated in order.

Figure 11B:
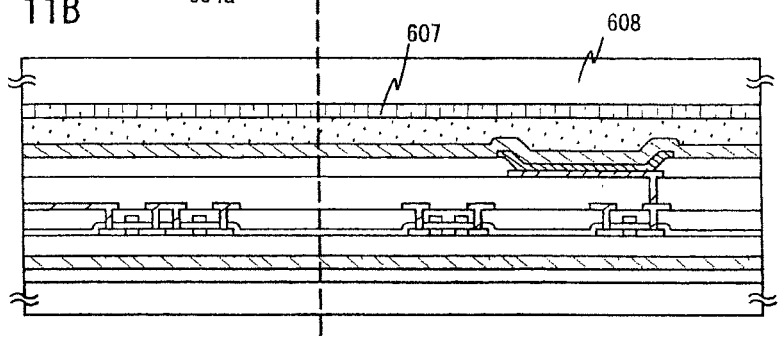

After the state shown in FIG. 11A is obtained by the above method, a support 608 is bonded to through a bonding layer 607 (FIG. 11B). In this embodiment, a plastic substrate is used as the support 608. Specifically, a resin substrate which has a thickness of 10 µm or more and is made of, for example, PES (polyether sulfone), PC (polycarbonate), PET (polyethylene terephthalate), or PEN (polyethylene naphthalate) can be used as the support. With respect to these plastic substrates, an effect of preventing entrance of a substance from external such as moisture or oxygen which promotes deterioration of an organic compound layer is small. Thus, for example, a single layer made of a material selected from aluminum nitride (AlN), aluminum nitride oxide ($AlN_xO_Y$ (X>Y)), aluminum oxynitride ($AlN_xO_Y$ (X<Y)), aluminum oxide ($Al_2O_3$), and beryllium oxide (BeO), or a laminate of those is preferably provided to cover the support which is the plastic substrate to obtain a structure for sufficiently preventing entrance of a substance from external such as moisture or oxygen which promotes deterioration of an organic compound layer. Note that, when aluminum nitride oxide ($AlN_xO_Y$ (X>Y)) is used, it is desirable that a concentration of nitrogen contained in the film is 10 atoms % to 80 atoms %. For example, the AlN film is formed by a sputtering method using an aluminum nitride (AlN) target having, preferably, purity of 2N or more in an atmosphere including a mixture of an argon gas and a nitrogen gas. The film may also be formed using an aluminum (Al) target in an atmosphere including a nitrogen gas.

Also, a sample obtained by sealing an OLED with a film substrate to which an $AlN_xO_Y$ film having a film thickness of 200 nm is provided is prepared and a sample obtained by sealing an OLED with a film substrate to which an SiN film having a film thickness of 200 nm is provided are prepared. Then, a test for examining a time variation in a water vapor atmosphere heated to 85° C. is conducted. As a result, as compared with the sample using the SiN film, the OLED in the sample using the $AlN_xO_Y$ film has a longer life and light emission can be produced for a longer time. From the test result, it can be read that the $AlN_xO_Y$ film is a material film capable of preventing entrance of a substance from external such as moisture or oxygen which promotes deterioration of an organic compound layer as compared with the SiN film.

Also, a structure in which only one surface of a plastic substrate is covered with these films (each made of AlN, $AlN_xO_Y$ (X>Y), or the like) may be used. In addition, these films (each made of AlN, $AlN_xO_Y$ (X>Y), or the like) may be formed on the interlayer insulating film 606.

Figure 18:
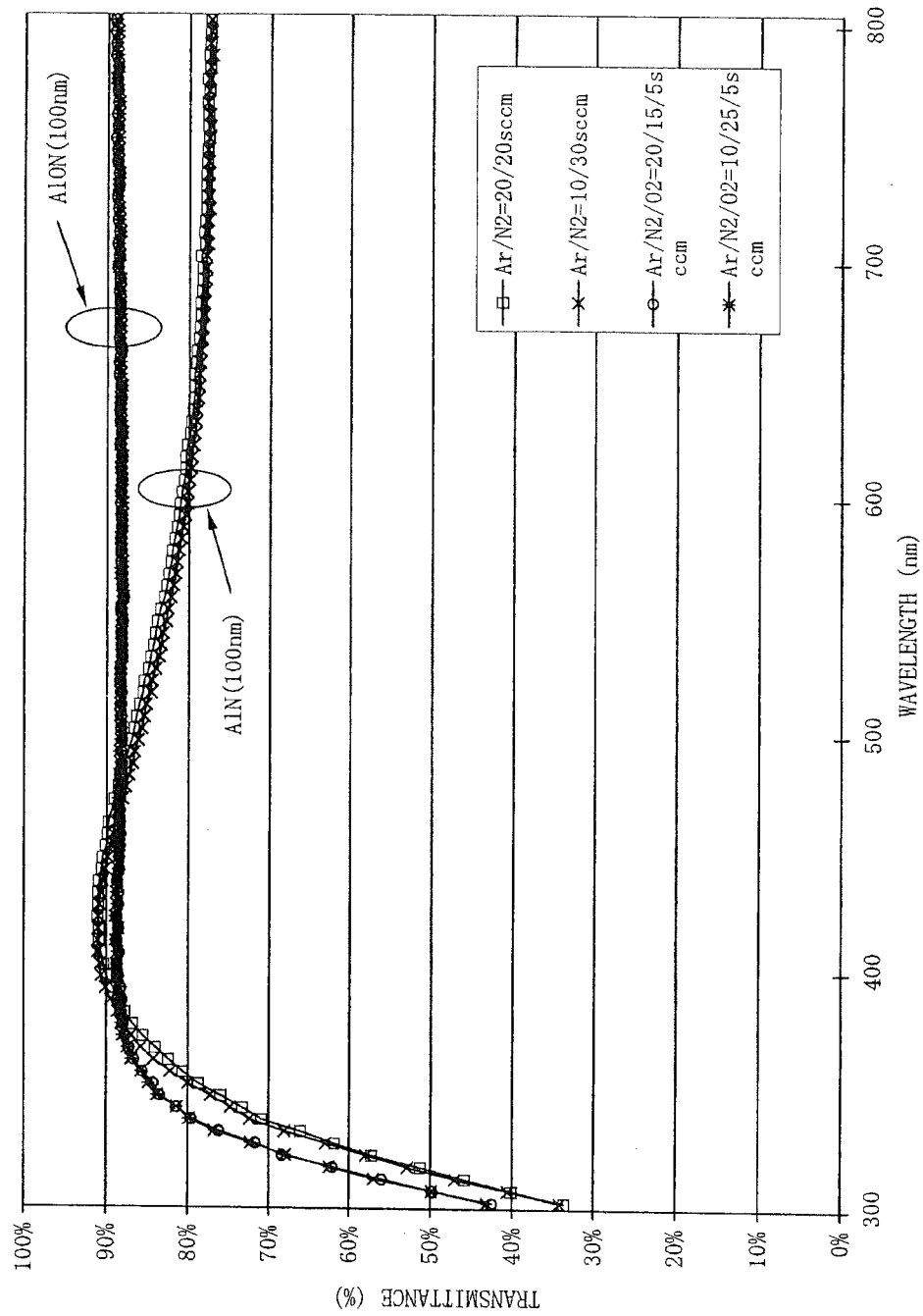
FIG. 18 is a graph indicating transmittances of an AlN film and an AlNO film.

Also, FIG. 18 shows transmittances of the AlN film and the $AlN_xO_Y$ (X>Y) film, each having the film thickness of 100 nm. As shown in FIG. 18, these films (each made of AlN, $AlN_xO_Y$ (X>Y), or the like) have very high transparent property (transmittance is 80% to 91.3% in a visible light range) and thus do not hinder light emission by a light emitting element. In addition, the films (each made of AlN, $AlN_xO_Y$ (X>Y), or the like) have a high thermal conductivity. Thus, there is a heat radiation effect.

Note that, when the support 608 and the bonding layer 607 are located on an observer side (light emitting device user side) in the case where they are viewed from the OLED, it is necessary that they may be made of a light transmitting material.

Figure 11C:
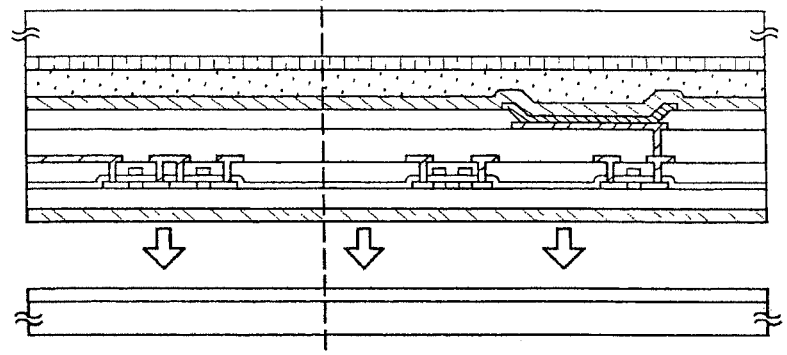

Next, any one of processings in Embodiment Modes 1 to 3 is performed to partially reduce the contact property, and then the substrate 600 to which the first material layer 601 is provided is peeled by physical means (FIG. 11C). Here, the second material layer 602 has compression stress and the first material layer 601 has tensile stress. Thus, the substrate can be peeled by relatively small force (for example, by the hand of a person, by a blowing pressure of a gas blown from a nozzle, by ultrasound, or the like).

Figure 11D:
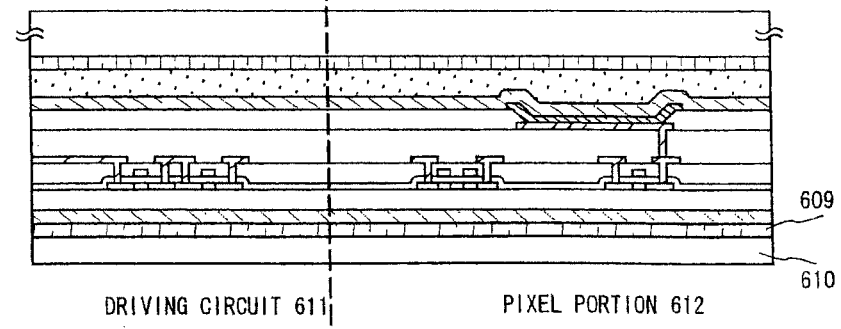

Next, a resultant layer after peeling is bonded to a transfer body 610 through a bonding layer 609 made of an epoxy resin or the like (FIG. 11D). In this embodiment, a plastic film substrate is used as the transfer body 610 for weight reduction.

As in the case of the support, it is preferable that a single layer made of a material selected from aluminum nitride (AlN), aluminum nitride oxide ($AlN_xO_Y$ (X>Y)), aluminum oxynitride ($AlN_xO_Y$ (X<Y)), aluminum oxide ($Al_2O_3$), and beryllium oxide (BeO), or a laminate of those is provided to the transfer body which is the plastic substrate to sufficiently prevent entrance of a substance from external such as moisture or oxygen which promotes deterioration of an organic compound layer.

Thus, a flexible light emitting device sandwiched by the flexible support 608 and the flexible transfer body 610 can be obtained. Note that, when the support 608 and the transfer body 610 are each made of the same material, the thermal expansion coefficients become equal to each other. Therefore, the influence of stress distortion due to temperature variation can be reduced.

Then, if necessary, the flexible support 608 and the flexible transfer body 610 are divided into desired shapes. Then, an FPC (not shown) is bonded by a known technique.

Embodiment 5

A structure of the EL module obtained by Embodiment 4 will be described using a top view and a cross sectional view of FIGS. 12A and 12B. A film substrate 900a corresponds to the transfer body 610 in Embodiment 4. An example in which a film having thermal conductivity 900b (typically, an aluminum nitride film or aluminum oxynitride film) is provided on the film substrate 900a is indicated here.

Figure 12A:
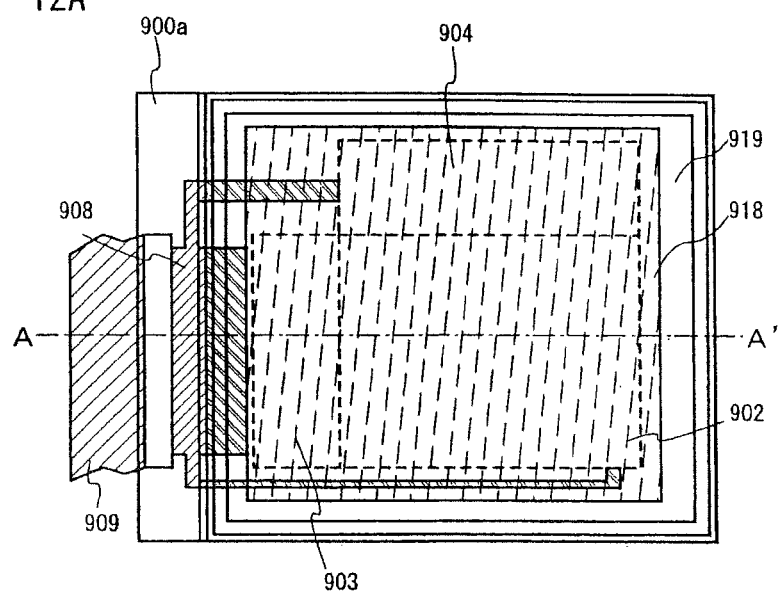
FIGS. 12A and 12B are explanatory views of Embodiment 5.
Figure 12B:
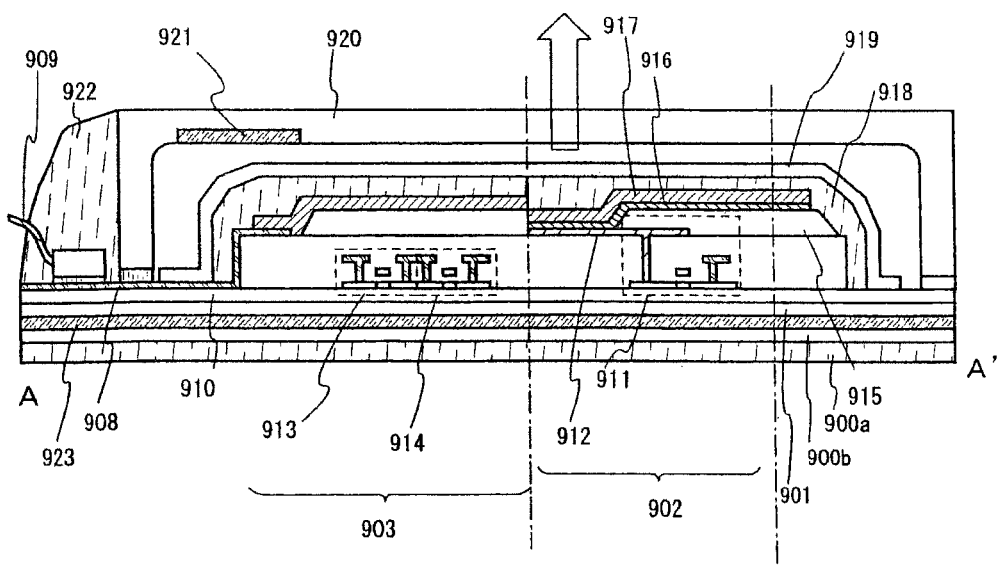

FIG. 12A is a top view showing the EL module and FIG. 12B is a cross sectional view obtained by cutting FIG. 12A along a line A-A'. In FIG. 12A, the film having thermal conductivity 900b is provided to the flexible film substrate 900a (for example, a plastic substrate), and a film having compression stress 901 (for example, a silicon oxide film) is bonded thereto through a bonding layer 923. A pixel portion 902, a source side driver circuit 904, and a gate side driver circuit 903 are formed on the film having compression stress 901. The pixel portion and the driver circuits can be obtained in accordance with the above Embodiment 1.

The above film having thermal conductivity 900b indicates a single layer made of a material selected from aluminum nitride (AlN), aluminum nitride oxide ($AlN_XO_Y$ (X>Y)), aluminum oxynitride ($AlN_XO_Y$ (X<Y)), aluminum oxide ($Al_2O_3$), and beryllium oxide (BeO), or a laminate of those. When the film having thermal conductivity 900b is provided, heat generated in the element can be radiated and it can be sufficiently prevented that a substance such as moisture or oxygen which promotes deterioration of an organic compound layer is entered from external.

Also, reference numeral 918 denotes an organic resin and 919 denotes a protective film. The pixel portion and the driver circuit portion are covered with the organic resin 918. The organic resin is covered with the protective film 919. Sealing is conducted using a cover member 920 through a bonding layer. The cover member 920 is bonded as the support before peeling. In order to suppress deformation due to heat, external force, and the like, it is desirable that a substrate having the same material as the film substrate 900a, for example, a plastic substrate is used as the cover member 920. Here, a substrate processed into a concave shape (3 µm to 10 µm in depth) as shown in FIG. 12B is used. It is preferable that the substrate is further processed to form a concave portion (50 µm to 200 µm in depth) capable of locating a dry agent 921. In addition, when the EL module is manufactured by a multiple gang printing, the substrate and the cover member may be bonded to each other and then divided using a $CO_2$ laser or the like so as to align end surfaces thereof.

Note that reference numeral 908 denotes a wiring for transferring signals inputted to the source side driver circuit 904 and the gate side driver circuit 903. The wiring 908 receives a video signal and a clock signal from an FPC (flexible printed circuit) 909 as an external input terminal. Note that only the FPC is shown here. However, a printed wiring board (PWB) may be attached to the FPC. The light emitting device in this specification includes not only a main body of the light emitting device but also a light emitting device to which the FPC or the PWB is attached.

Next, the cross sectional structure will be described using FIG. 12B. The film having thermal conductivity 900b is provided on the film substrate 900a, the film having compression stress 901 is boned thereto through the bonding layer 923, and an insulating film 910 is formed thereon. The pixel portion 902 and the gate side driver circuit 903 are formed over the insulating film 910. The pixel portion 902 is composed of a plurality of pixels each including a current control TFT 911 and a pixel electrode 912 electrically connected with the drain thereof. In addition, the gate side driver circuit 903 is composed of a CMOS circuit in which an n-channel TFT 913 and a p-channel TFT 914 are combined.

These TFTs (including 911, 913, and 914) are preferably manufactured in accordance with the n-channel TFT and the p-channel TFT in the above Embodiment 1.

Note that, after the pixel portion 902, the source side driver circuit 904, and the gate side driver circuit 903 are formed on the same substrate in accordance with Embodiments 1 and 2, a support (here, a cover member) is bonded in accordance with Embodiment 2 and then a substrate (not shown) is peeled. Then, the film substrate 900a on which the film having thermal conductivity 900b is provided is bonded through the bonding layer 923.

Also, when the cover member 920 having the concave shape shown in FIG. 12B is used, the cover member 920 as the support is bonded. Note that a wiring lead terminal portion (connection portion) has only the insulating film 910 at the time of peeling, thereby lowering a mechanical strength. Thus, it is desirable that the FPC 909 is bonded before peeling and is fixed using the organic resin 922.

Note that, a material which not only blocks diffusion of an impurity ion such as an alkali metal ion or an alkali earth metal ion but also actively absorbs an impurity ion such as an alkali metal ion or an alkali earth metal ion is preferably used for the insulating film provided between the TFT and the OLED. Further, a material resistant to a later process temperature is suitable. As an example of a material fit to such conditions, there is a silicon nitride film including a large amount of fluorine. A concentration of fluorine contained in the silicon nitride film is preferably set to be $1 \times 10^{19}/cm^3$ or more. Preferably, a composition proportion of fluorine in the silicon nitride film is set to be 1% to 5%. Fluorine in the silicon nitride film is bonded to an alkali metal ion, an alkali earth metal ion, or the like, thereby being absorbed in the film. In addition, as another example, there is an organic resin film including a particle which is made of an antimony (Sb) compound, a tin (Sn) compound, or an indium (In) compound for absorbing an alkali metal ion, an alkali earth metal ion, or the like, for example, an organic resin film including an antimony pentoxide particle ($Sb_2O_5 \cdot nH_2O$). Note that the organic resin film includes a particle with an average grain size of 10 nm to 20 nm and has very high transparent property. The antimony compound represented by the antimony pentoxide particle is easy to absorb an impurity ion such as an alkali metal ion or an alkali earth metal ion.

The pixel electrode 912 serves as a cathode of the light emitting element (OLED). Banks 915 are formed at both ends of the pixel electrode 912. An organic compound layer 916 and an anode 917 of the light emitting element are formed on the pixel electrode 912.

As the organic compound layer 916, an organic compound layer (layer for causing light emission and carrier transfer therefor) formed by freely combining a light emitting layer, a charge transport layer, and a charge injection layer is preferably used. For example, a low molecular system organic compound material or a polymer system organic compound material is preferably used. In addition, as the organic compound layer 916, a thin film made of a light emitting material in which light emission (fluorescence) is produced by singlet excitation (singlet compound) or a thin film made of a light emitting material in which light emission (phosphorescence) is produced by triplet excitation (triplet compound) can be used. In addition, an inorganic material such as silicon carbide can be used for the charge transport layer and the charge injection layer. known materials can be used as the organic materials and the inorganic material.

The anode 917 also serves as a wiring common to all pixels and is electrically connected with the FPC 909 through the connection wiring 908. Further, all elements contained in the pixel portion 902 and the gate side driver circuit 903 are covered with the anode 917, the organic resin 918, and the protective film 919.

Note that, it is preferable that a material which is transparent or semitransparent with respect to visible light is used as the organic resin 918. In addition, it is desirable that the organic resin 918 is a material which does not transmit moisture and oxygen.

Also, after the light emitting element is completely covered with the organic resin 918, it is preferable that at least the protective film 919 is provided on the surface (exposed surface) of the organic resin 918 as shown in FIGS. 12A and 12B. The protective film may be formed on the entire surface including the rear surface of the substrate. Here, it is required that the protective film is not formed on a portion to which the external input terminal (FPC) is provided. It may be made so as not to form the protective film using a mask. Or, it may be made so as not to form the protective film by covering the external input terminal portion with a tape made of Teflon (registered trademark) or the like used as a masking tape in a CVD apparatus. A film having the same thermal conductivity as the film 900b may be used as the protective film 919.

When the light emitting element is sealed with the protective film 919 in the above structure, the light emitting element can be completely shielded from external and it can be prevented that a substance such as moisture or oxygen which promotes deterioration due to oxidation of an organic compound layer is entered from external. In addition, heat can be diffused by the film having the thermal conductivity 900b. Thus, a light emitting device having high reliability can be obtained.

Figure 13:
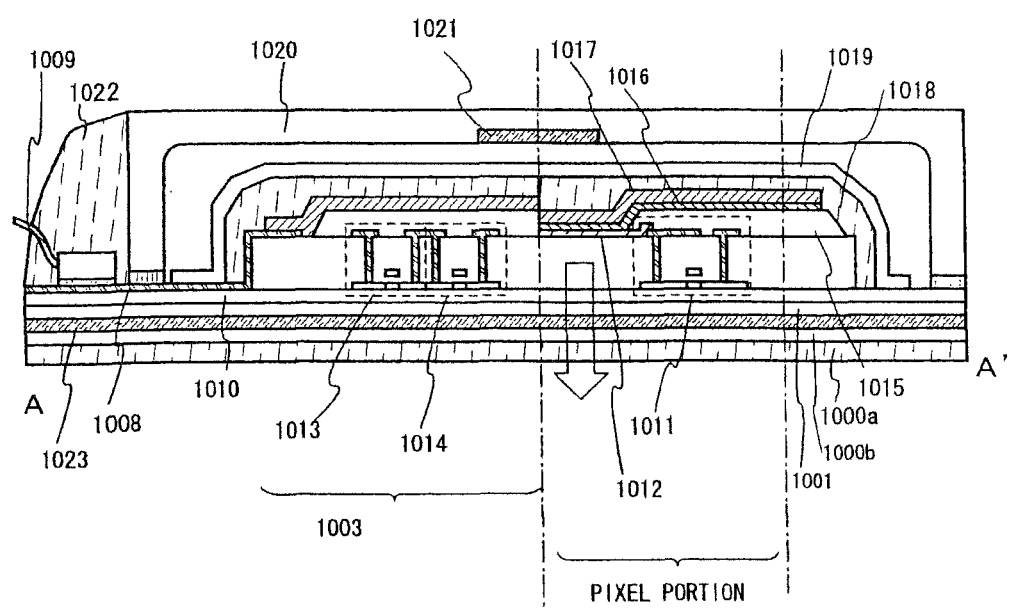
FIG. 13 is an explanatory view of Embodiment 5.

Also, a structure in which the pixel electrode is used as the anode, and the organic compound layer and the cathode are laminated to produce light emission in a direction opposite to the light emitting direction shown in FIG. 12 may be used. FIG. 13 shows an example. Note that the top view is the same drawing as FIG. 12A and is omitted here.

The cross sectional structure shown in FIG. 13 will be described below. A film having thermal conductivity 1000b is provided to a film substrate 1000a and an insulating film 1010 is formed thereover. A pixel portion 1002 and a gate side driver circuit 1003 are formed over the insulating film 1010. The pixel portion 1002 is composed of a plurality of pixels each including a current control TFT 1011 and a pixel electrode 1012 electrically connected with the drain thereof. Note that, after a layer to be peeled formed on the substrate is peeled in accordance with Embodiment Modes, the film substrate 1000a to which the film having the thermal conductivity 1000b is provided is bonded through a bonding layer 1023. In addition, A gate side driver circuit 1003 is composed of a CMOS circuit in which an n-channel TFT 1013 and a p-channel TFT 1014 are combined.

The above film having the thermal conductivity 1000b indicates a single layer made of a material selected from aluminum nitride (AlN), aluminum nitride oxide ($AlN_XO_Y$ (X>Y)), aluminum oxynitride ($AlN_XO_Y$ (X<Y)), aluminum oxide ($Al_2O_3$), and beryllium oxide (BeO), or a laminate of those. When the film having the thermal conductivity 1000b is provided, heat generated in the element can be radiated and it can be sufficiently prevented that a substance such as moisture or oxygen which promotes deterioration of an organic compound layer is entered from external.

These TFTs (including 1011, 1013, and 1014) are preferably manufactured in accordance with the n-channel 201 and the p-channel TFT 202 in the above Embodiment 1.

The pixel electrode 1012 serves as an anode of the light emitting element (OLED). Banks 1015 are formed at both ends of the pixel electrode 1012. An organic compound layer 1016 and a cathode 1017 of the light emitting element are formed on the pixel electrode 1012.

The anode 1017 also serves as a wiring common to all pixels and is electrically connected with a FPC 1009 through a connection wiring 1008. Further, all elements contained in the pixel portion 1002 and the gate side driver circuit 1003 are covered with the anode 1017, an organic resin 1018, and a protective film 1019. A film having the same thermal conductivity as the film 1000b may be used as the protective film 1019. It is bonded to a cover member 1020 through a bonding layer. A concave portion is provided to the cover member and a dry agent 1021 is located therein.

When the cover member 1020 having the concave shape shown in FIG. 13 is used, the cover member 1020 as the support is bonded. Note that a wiring lead terminal portion (connection portion) has only the insulating film 1010 at the time of peeling, thereby lowering a mechanical strength. Thus, it is desirable that the FPC 1009 is bonded before peeling and is fixed using an organic resin 1022.

Also, in FIG. 13, the pixel electrode is used as the anode, and the organic compound layer and the cathode are laminated. Thus, a light emitting direction becomes a direction indicated by an arrow in FIG. 13.

Although, the example of a top gate TFT is described here, the present invention can be applied independent of the TFT structure. The present invention can also be applied to, for example, a bottom gate (inverse staggered) TFT or a staggered TFT.

Embodiment 6

The example in which the top gate TFT is used is described in Embodiment 5. However, a bottom gate TFT can also be used. An example in which the bottom gate TFT is used is shown in FIG. 14.

Figure 14:
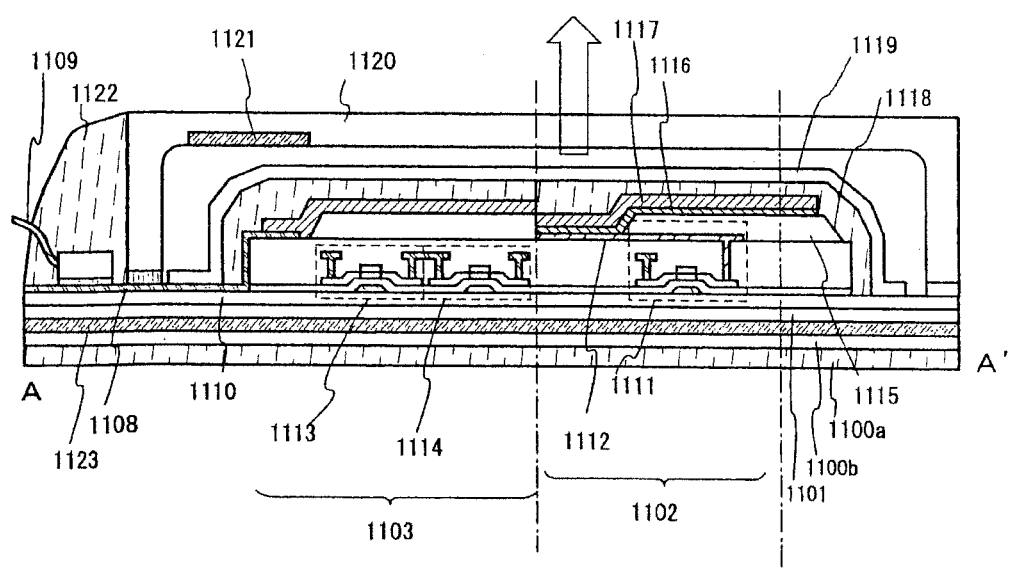
FIG. 14 is an explanatory view of Embodiment 6.

As shown in FIG. 14, the bottom gate structure is used for an n-channel TFT 1113, a p-channel TFT 1114, and an n-channel TFT 1111. The bottom gate structure is preferably obtained by using a known technique. Note that each active layer of these TFTs may be a semiconductor film having a crystalline structure (made of polysilicon or the like) or a semiconductor film having an amorphous structure (made of amorphous silicon or the like).

Also, in FIG. 14, reference numeral 1100a denotes a flexible film substrate (for example, a plastic substrate), 1100b denotes a film having thermal conductivity, 1101 denotes a film having compression stress (for example, silicon oxide film), 1102 denotes a pixel portion, 1103 denotes a gate side driver circuit, 1110 denotes an insulating film, 1112 denotes a pixel electrode (cathode), 1115 denotes banks, 1116 denotes an organic compound layer, 1117 denotes an anode, 1118 denotes an organic resin, 1119 denotes a protective film, 1120 denotes a cover member, 1121 denotes a dry agent, 1122 denotes an organic resin, and 1123 denotes a bonding layer.

The above film having the thermal conductivity 1100b indicates a single layer made of a material selected from aluminum nitride (AlN), aluminum nitride oxide ($AlN_XO_Y$ (X>Y)), aluminum oxynitride ($AlN_XO_Y$ (X<Y)), aluminum oxide ($Al_2O_3$), and beryllium oxide (BeO), or a laminate of those. When the film having the thermal conductivity 1100b is provided, heat generated in the element can be radiated and it can be sufficiently prevented that a substance such as moisture or oxygen which promotes deterioration of an organic compound layer is entered from external. In addition, a film having the same thermal conductivity as the film 1100b may be used as the protective film 1119.

Also, the structure except for the n-channel TFT 1113, the p-channel TFT 1114, and the n-channel TFT 1111 is the same as that of Embodiment 5 and the description is omitted here.

Embodiment 7

The driver circuit portion and the pixel portion fabricated by implementing the present invention can be utilized for various modules (active matrix liquid crystal module, active matrix EL module and active matrix EC module). Namely, all of the electronic apparatuses are completed by implementing the present invention.

Following can be given as such electronic apparatuses: video cameras, digital cameras, head mounted displays (goggle type displays), car navigation systems, projectors, car stereos, personal computers, portable information terminals (mobile computers, mobile phones or electronic books etc.). Examples of these are shown in FIGS. 15A to 15F and 16A to 16C.

FIG. 15A is a personal computer which comprises a main body 2001, an image input section 2002; a display section 2003, a keyboard 2004 and the like. The present invention is applicable to the display section 2003.

FIG. 15B is a video camera which comprises a main body 2101, a display section 2102, a voice input section 2103, operation switches 2104, a battery 2105, an image receiving section 2106 and the like. The present invention is applicable to the display section 2102.

FIG. 15C is a mobile computer which comprises a main body 2201, a camera section 2202, an image receiving section 2203, operation switches 2204, a display section 2205 and the like. The present invention is applicable to the display section 2205.

FIG. 15D is a goggle type display which comprises a main body 2301, a display section 2302, an arm section 2303 and the like. The present invention is applicable to the display section 2302.

FIG. 15E is a player using a recording medium which records a program (hereinafter referred to as a recording medium) which comprises a main body 2401, a display section 2402, a speaker section 2403, a recording medium 2404, operation switches 2405 and the like. This apparatus uses DVD (Digital Versatile Disc), CD, etc. for the recording medium, and can perform music appreciation, film appreciation, games and use for Internet. The present invention is applicable to the display section 2402.

FIG. 15F is a digital camera which comprises: a main body 2501, a display section 2502, a view finder 2503, operation switches 2504, an image receiving section (not shown in the figure) and the like. The present invention is applicable to the display section 2502.

Figure 16A:
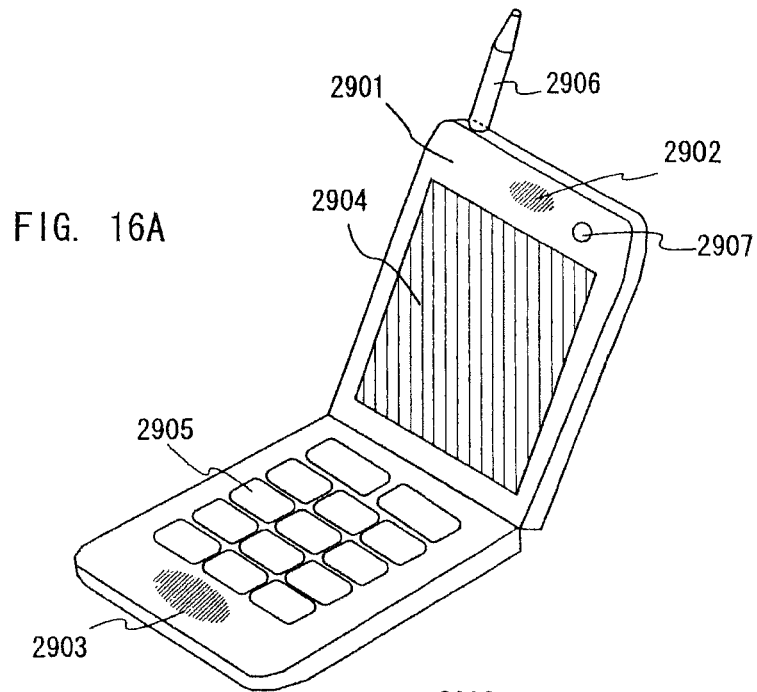
FIGS. 16A to 16C show examples of electronic devices.

FIG. 16A is a mobile phone which comprises a main body 2901, a voice output section 2902, a voice input section 2903, a display section 2904, operation switches 2905, an antenna 2906, an image input section (CCD, image sensor, etc.) 2907 and the like. The present invention is applicable to the display section 2904.

Figure 16B:
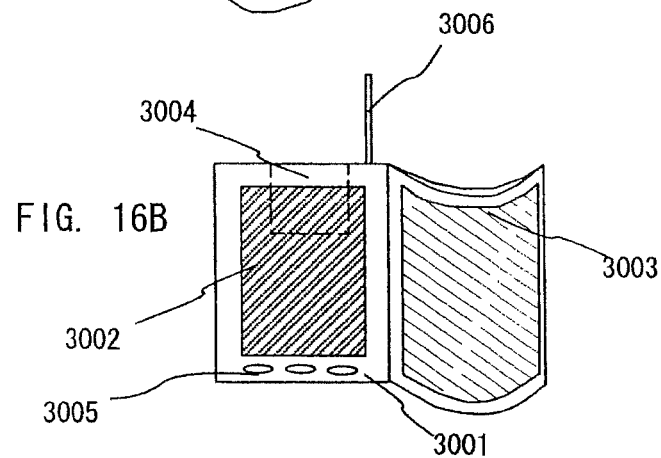

FIG. 16B is a portable book (electronic book) which comprises a main body 3001, display sections 3002 and 3003, a recording medium 3004, operation switches 3005, an antenna 3006 and the like. The preset invention is applicable to the display sections 3002 and 3003.

Figure 16C:
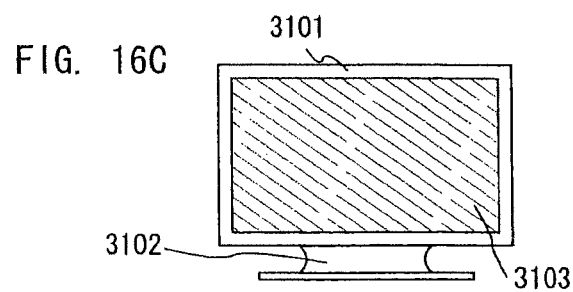

FIG. 16C is a display which comprises a main body 3101, a supporting section 3102, a display section 3103 and the like. The present invention is applicable to the display section 3103.

In addition, the display shown in FIG. 16C is small and medium type or large type, for example, 5 to 20 inches screen display. Moreover, it is preferable to mass-produce by performing a multiple pattern using 1×1 m substrate to form such sized display section.

As described above, the applicable range of the present invention is very large and the invention can be applied to methods of electronic apparatuses of various areas. Note that the electronic devices of this embodiment can be achieved by utilizing any combination of constitutions in Embodiments 1 to 6.

Embodiment 8

In this embodiment, an example in which an electrophoretic display device is used as the display portion described in Embodiment 7 is shown. Typically, it is applied to the display portion 3002 or 3003 of the portable book (electronic book) shown in FIG. 16B.

The electrophoretic display device (electrophoretic display) is also called an electronic paper and there is an advantage that it is easy to read like paper. In addition, a thin and light weight device with lower consumption power as compared with another display device can be obtained.

With respect to the electrophoretic display, various types can be considered. One is produced by dispersing a plurality of micro capsules which contain a first particle having a positive charge and a second particle having a negative charge in a solvent or a solute. Then, when an electric field is applied to the micro capsules, particles in the respective micro capsules are moved in opposite directions to display only color of particles collected in one side. Note that the first particle or the second particle includes pigment and they do not move in the case where no electric field is generated. In addition, it is assumed that the color of the first particle and that of the second particle are different from each other (including the case where it is colorless).

Thus, the electrophoretic display is a display utilizing a so-called dielectric migration effect such as a substance having a high dielectric constant is moved to a high electric field region. In the case of the electrophoretic display, a polarizing plate and a counter electrode which are required for a liquid crystal display device is unnecessary. Thus, a thickness and a weight are reduced in half.

When the above micro capsules are dispersed in a solvent, it is called an electronic ink. The electronic ink can be printed on the surface of glass, plastic, a cloth, a paper, and the like. In addition, when a color filter or a particle having pigment is used, color display is possible.

When the plurality of micro capsules are located on an active matrix substrate as appropriate so as to be sandwiched between two electrodes, an active matrix display device is completed. Thus, when an electric field is applied to the micro capsules, display can be conducted. For example, the active matrix substrate obtained in Embodiment 1 can be used. The electronic ink can be directly printed on a plastic substrate. When an active matrix type is used, as compared with the case where an element is formed on a plastic film which is sensitive to heat and an organic solvent, a process margin is preferably improved when an element and an electronic ink are formed on a glass substrate, and then the glass substrate is peeled in accordance with Embodiment Modes 1 to 3 and Embodiment 2 before being bonded to a plastic substrate.

Note that as the first particle and the second particle in the micro capsules, a conductor material, an insulator material, a semiconductor material, a magnetic material, a liquid crystal material, a ferroelectric material, an electroluminescence material, an electrochromic material, and an electrophoretic material, or a compound material thereof is preferably used.

According to the present invention, not only a layer to be peeled having a small area but also a layer to be peeled having a large area can be peeled over the entire surface at a high yield.

In addition, according to the present invention, the layer to be peeled can be easily peeled by the physical means, for example, by the hand of a person. Thus, it may be a process suitable to mass production. In addition, when a manufacturing apparatus for peeling a layer to be peeled is produced for mass production, a large size manufacturing apparatus can be produced at a low cost.

What is claimed is:

1. A method of manufacturing a display device comprising:
    forming an organic material layer over a first substrate;
    forming a first insulating film over the organic material layer;
    forming a thin film transistor over the first insulating film, the thin film transistor comprising a semiconductor layer including a channel forming region, a gate electrode and a gate insulating layer between the gate electrode and the semiconductor layer;
    forming a second insulating film over the thin film transistor;
    forming a pixel electrode over the second insulating film, wherein the pixel electrode is electrically connected to the thin film transistor;
    forming a light emitting layer over the pixel electrode, the light emitting layer comprising an organic material;
    forming a second electrode over the light emitting layer;
    forming a third insulating film over the second electrode;
    attaching a first resin film to the third insulating film by an adhesive layer between the first resin film and the third insulating film;
    irradiating the organic material layer with a laser light through the first substrate after attaching the first resin film;
    separating the first substrate from the organic material layer after the irradiating with the laser light; and
    attaching a second resin film to the organic material layer by a second adhesive layer between the second resin film and the organic material layer.

2. The method according to claim 1, wherein the organic material layer has a compressive stress.

3. The method according to claim 1, further comprising a second material layer over the first substrate before forming the organic material layer, wherein the organic material layer has a compressive stress and the second material layer has a tensile stress.

4. The method according to claim 1, wherein the laser light is directed to a portion of the organic material layer, the portion being distant from an edge of the organic material layer.

5. The method according to claim 1, wherein only a portion of the organic material layer is irradiated with the laser light.

6. A method of manufacturing a display device comprising:
    forming an organic material layer over a first substrate;
    forming a first insulating film over the organic material layer;
    forming a thin film transistor over the first insulating film, the thin film transistor comprising a semiconductor layer including a channel forming region, a gate electrode and a gate insulating layer between the gate electrode and the semiconductor layer;
    forming a second insulating film over the thin film transistor;
    forming a pixel electrode over the second insulating film, wherein the pixel electrode is electrically connected to the thin film transistor;
    irradiating the organic material layer with a linear shape laser light through the first substrate, wherein the organic material layer is scanned with the linear shape laser light along a first direction;
    separating the first substrate from the organic material layer after the irradiating with the linear shape laser light, wherein the step of separating the first substrate is performed along the first direction; and
    attaching a resin film to the organic material layer by an adhesive layer between the resin film and the organic material layer.

7. The method according to claim 6, wherein the organic material layer has a compressive stress.

8. The method according to claim 6, further comprising a second material layer over the first substrate before forming the organic material layer, wherein the organic material layer has a compressive stress and the second material layer has a tensile stress.

9. The method according to claim 6, wherein the linear shape laser light is directed to a portion of the organic material layer, the portion being distant from an edge of the organic material layer.

10. A method of manufacturing a display device comprising:
    forming an organic material layer over a first substrate;
    forming a first insulating film over the organic material layer;
    forming a thin film transistor over the first insulating film, the thin film transistor comprising a semiconductor layer including a channel forming region, a gate electrode and a gate insulating layer between the gate electrode and the semiconductor layer;
    forming a second insulating film over the thin film transistor;
    forming a pixel electrode over the second insulating film, wherein the pixel electrode is electrically connected to the thin film transistor;
    forming a light emitting layer over the pixel electrode, the light emitting layer comprising an organic material;
    forming a second electrode over the light emitting layer;
    forming a third insulating film over the second electrode, the third insulating film comprising a material selected from the group consisting of aluminum nitride, aluminum nitride oxide, aluminum oxynitride, and aluminum oxide;
    attaching a first resin film to the third insulating film by an adhesive layer between the first resin film and the third insulating film;
    irradiating the organic material layer with a laser light through the first substrate after attaching the first resin film;

separating the first substrate from the organic material layer after the irradiating with the laser light; and attaching a second resin film to the organic material layer by a second adhesive layer between the second resin film and the organic material layer.

11. The method according to claim 10, wherein the organic material layer has a compressive stress.

12. The method according to claim 10, further comprising a second material layer over the first substrate before forming the organic material layer, wherein the organic material layer has a compressive stress and the second material layer has a tensile stress.

13. The method according to claim 10, wherein the laser light is directed to a portion of the organic material layer, the portion being distant from an edge of the organic material layer.

14. The method according to claim 10, wherein only a portion of the organic material layer is irradiated with the laser light.

* * * * *